(12) United States Patent
Yamaguchi et al.

(10) Patent No.: US 6,400,129 B1
(45) Date of Patent: *Jun. 4, 2002

(54) APPARATUS FOR AND METHOD OF DETECTING A DELAY FAULT IN A PHASE-LOCKED LOOP CIRCUIT

(75) Inventors: Takahiro Yamaguchi; Masahiro Ishida, both of Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/494,321

(22) Filed: Jan. 28, 2000

Related U.S. Application Data

(63) Continuation-in-part of application No. 09/251,096, filed on Feb. 16, 1999.

(51) Int. Cl.⁷ ................................................ G01R 25/00
(52) U.S. Cl. ..................... 324/76.82; 375/371; 375/373; 702/72
(58) Field of Search ........................... 324/76.54, 76.82, 324/76.15, 76.55, 461; 375/373, 371; 702/72

(56) References Cited

U.S. PATENT DOCUMENTS

| | | | | |
|---|---|---|---|---|
| 4,439,737 A | * | 3/1984 | Mattei | 329/50 |
| 4,686,569 A | * | 8/1987 | Campbell et al. | 358/167 |
| 4,704,574 A | * | 11/1987 | Nossen | 324/76.82 |
| 5,361,277 A | * | 11/1994 | Grover | 375/107 |
| 5,578,917 A | * | 11/1996 | Bottman | 324/76.15 |

* cited by examiner

*Primary Examiner*—Safet Metjahic
*Assistant Examiner*—Vincent Q. Nguyen
(74) *Attorney, Agent, or Firm*—David N. Lathrop, Esq.; Gallagher & Lathrop

(57) ABSTRACT

There is provided a method and an apparatus for detecting a delay fault in a phase-locked loop circuit. A frequency impulse is applied to the PLL circuit under test as a reference clock, and a waveform of a signal outputted from the PLL circuit under test is transformed to an analytic signal to estimate its instantaneous phase. A linear phase is estimated from the estimated instantaneous phase, and the estimated linear phase is removed from the estimated instantaneous phase to obtain a fluctuation term of the instantaneous phase. A delay fault is detected by comparing a time duration during which the PLL circuit stays in a state of oscillating a certain frequency with the time duration during which a fault-free PLL circuit stays in a state of oscillating a certain frequency.

10 Claims, 22 Drawing Sheets

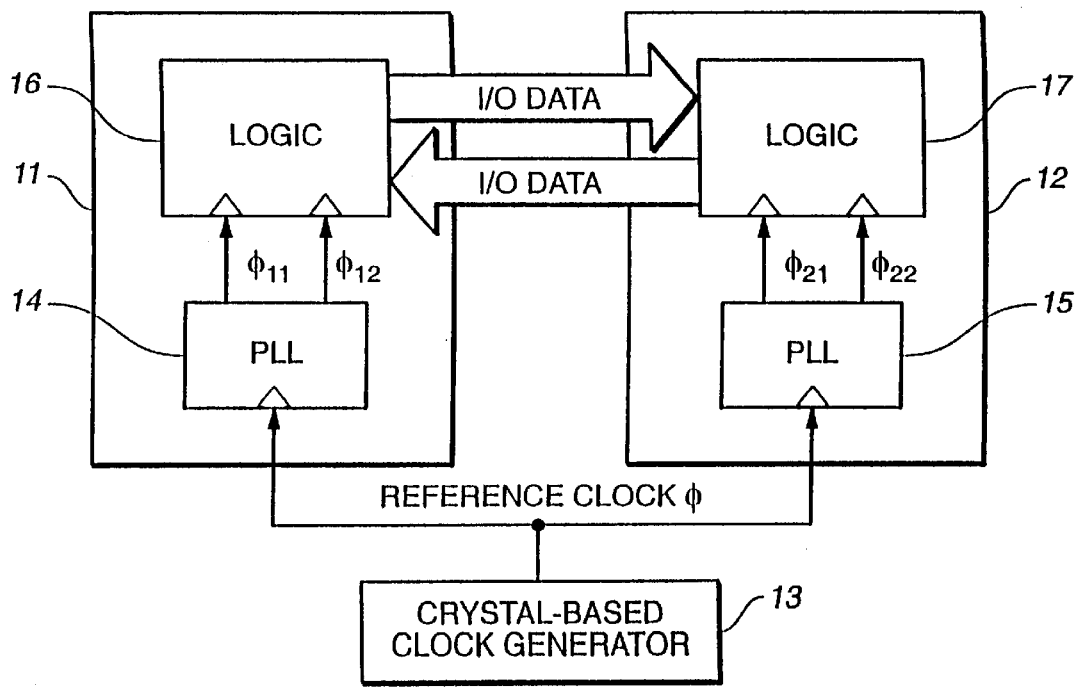
FIG._1
(PRIOR ART)
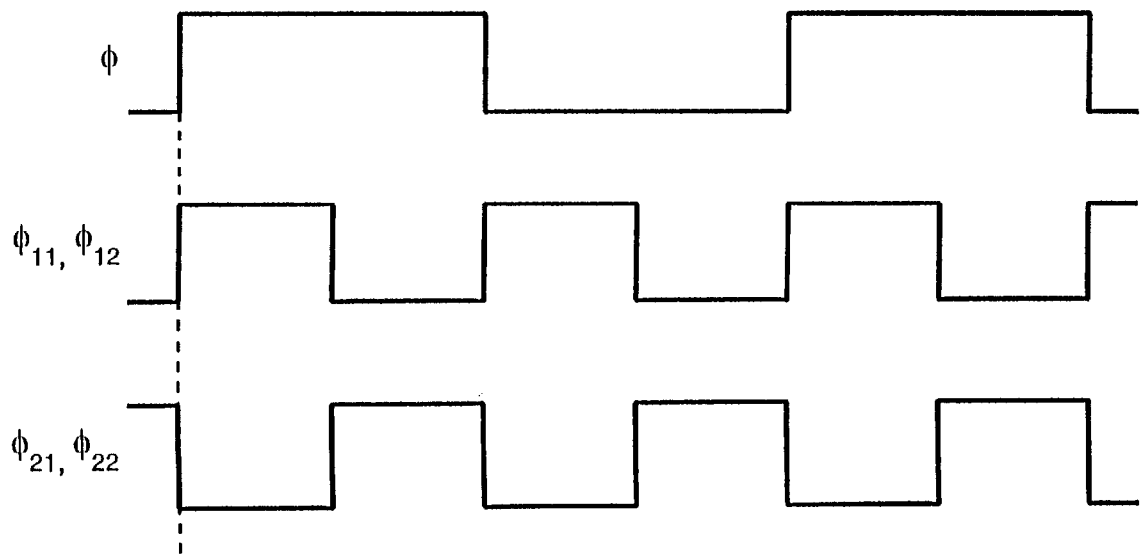
FIG._2
(PRIOR ART)

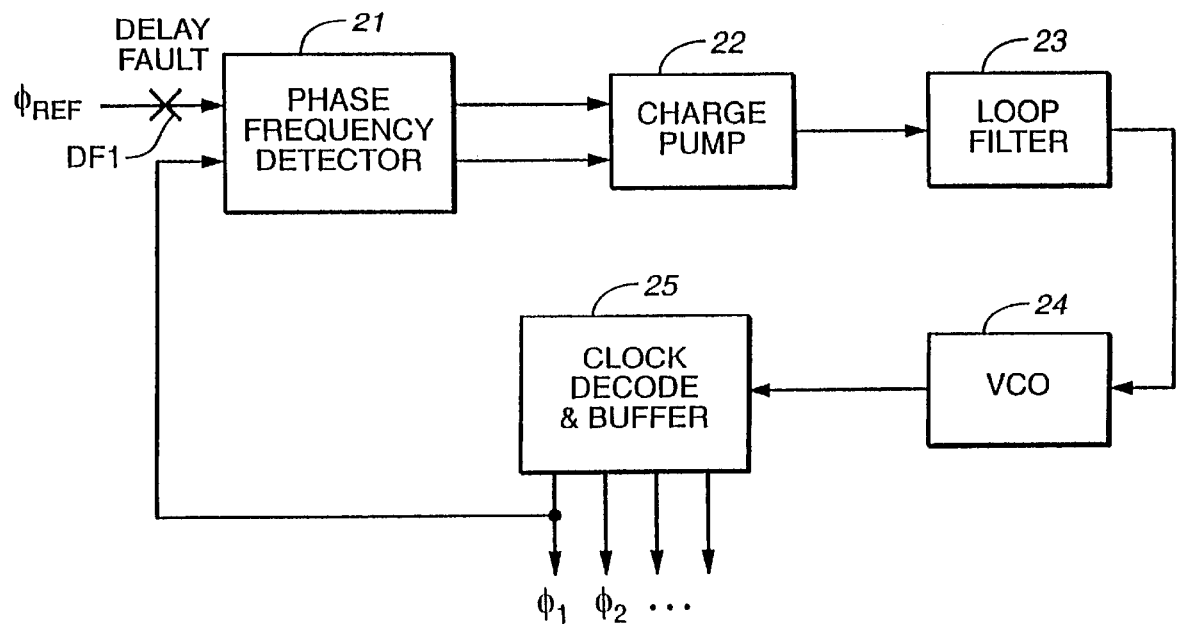
FIG._3
*(PRIOR ART)*
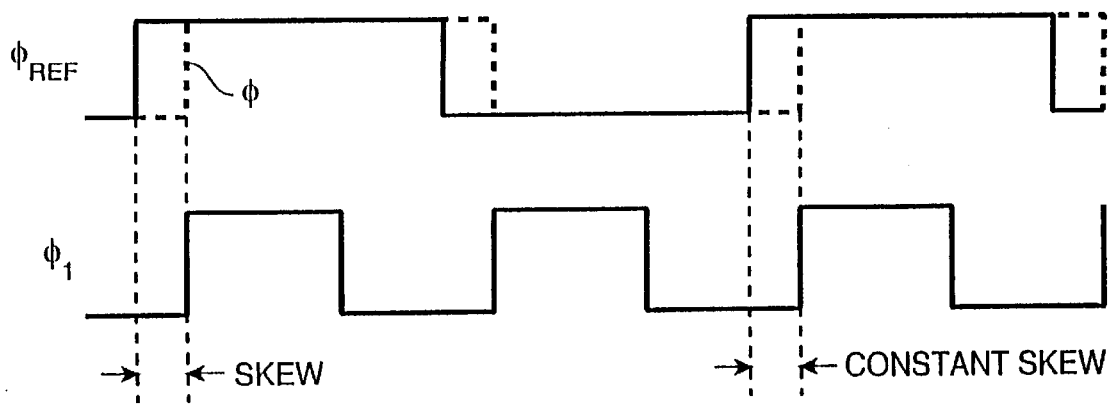
FIG._4
*(PRIOR ART)*

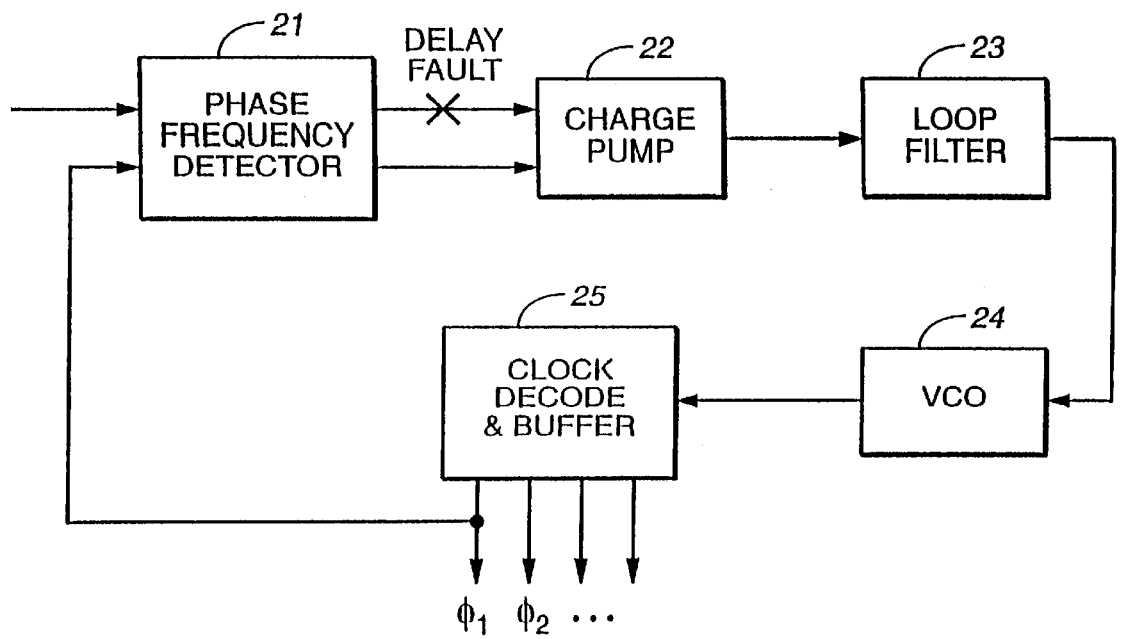
FIG._5
*(PRIOR ART)*
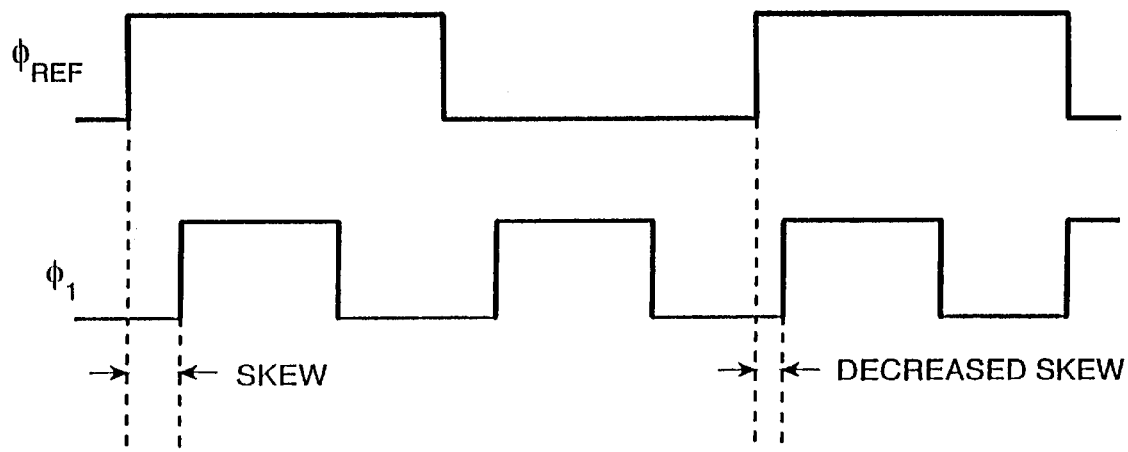
FIG._6
*(PRIOR ART)*

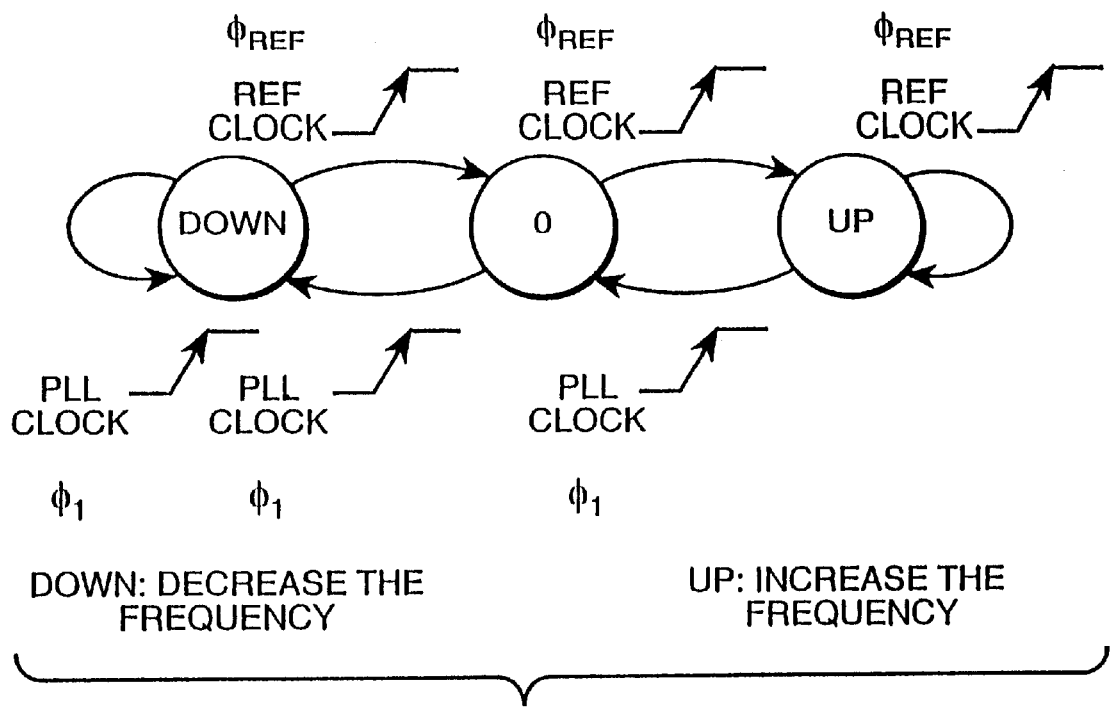
FIG._7
*(PRIOR ART)*
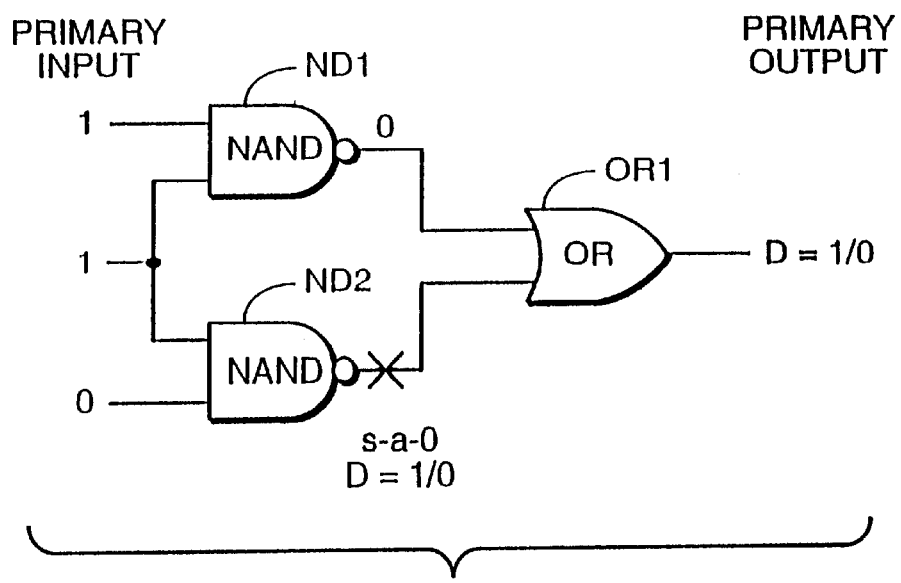
FIG._8
*(PRIOR ART)*

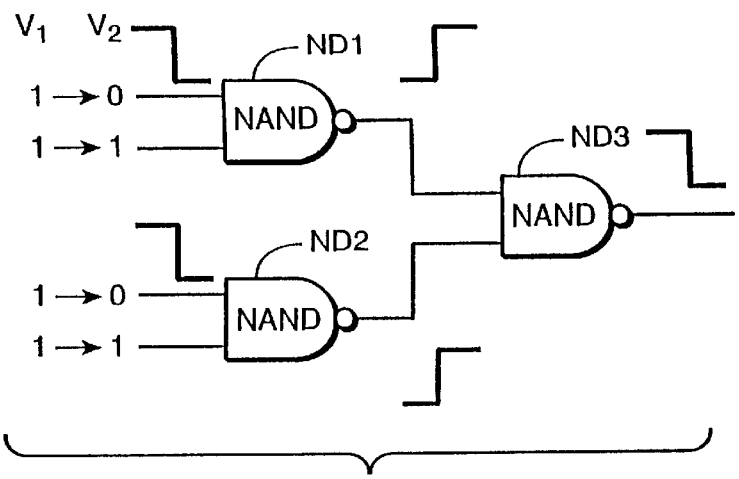
FIG._9
*(PRIOR ART)*
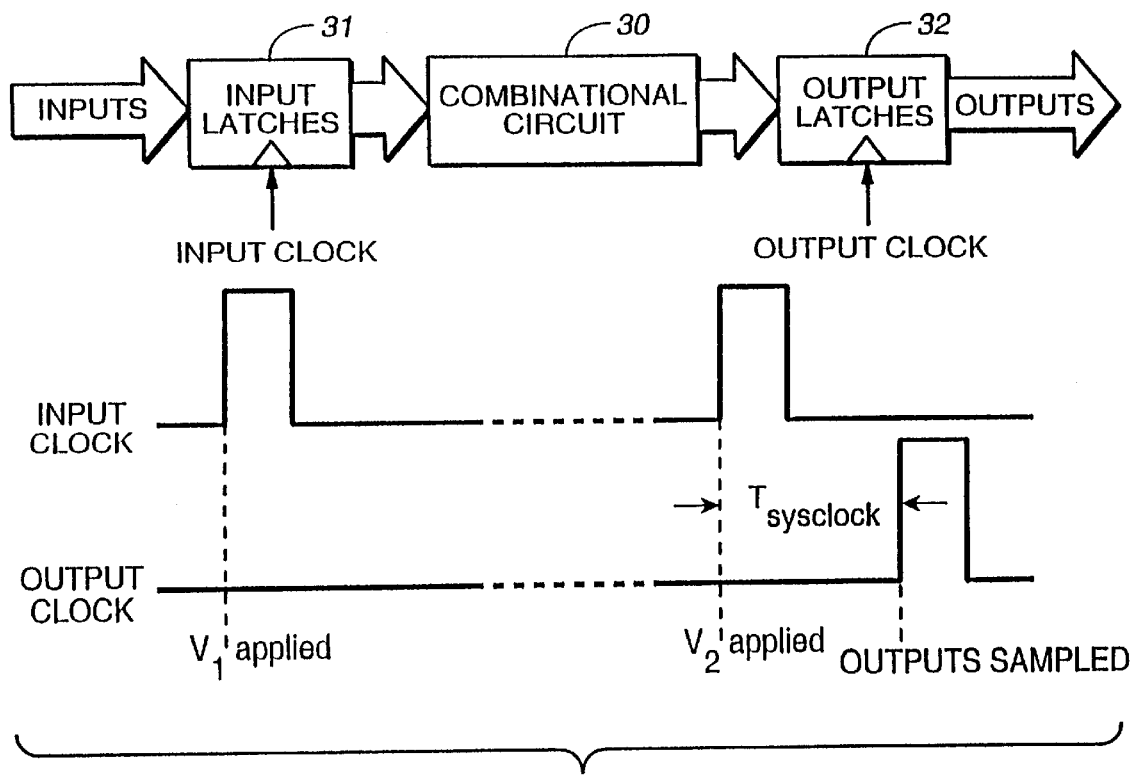
FIG._10
*(PRIOR ART)*

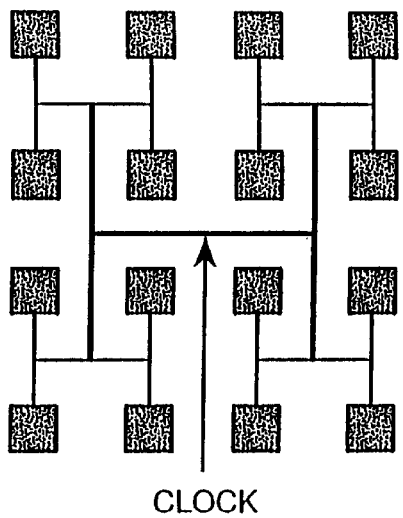
CLOCK
FIG._11
(PRIOR ART)
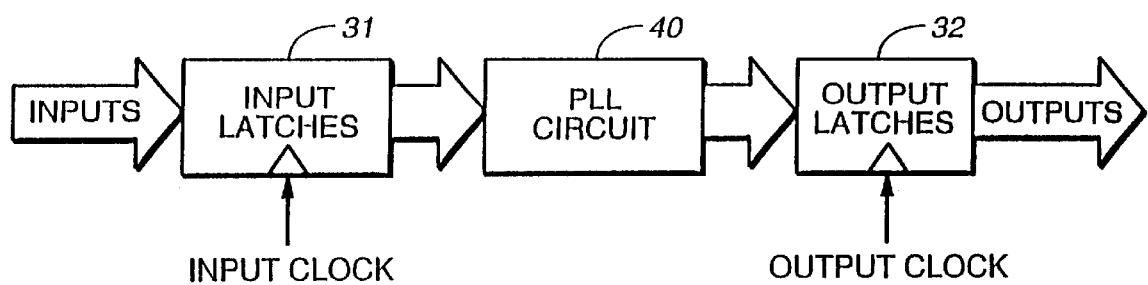
FIG._12
(PRIOR ART)

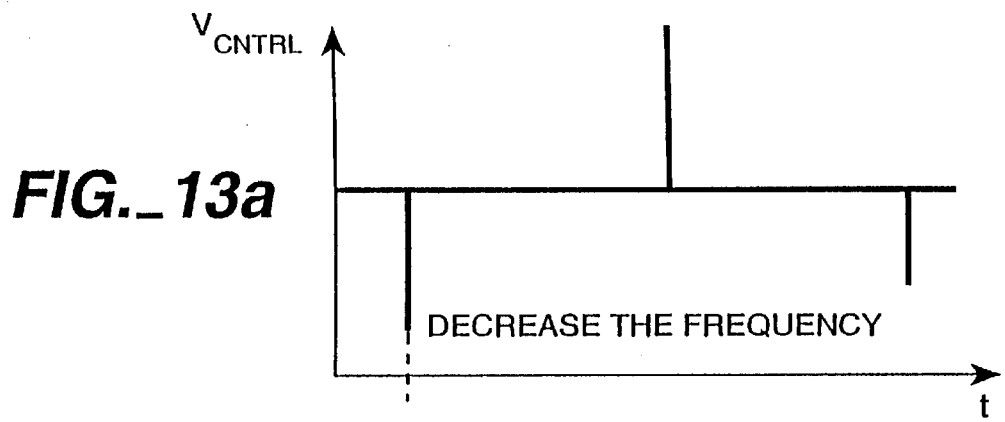
FIG._13a
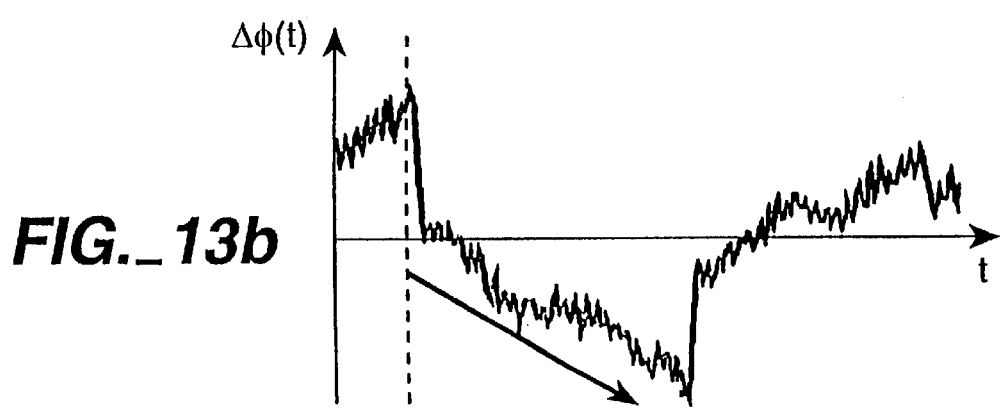
FIG._13b
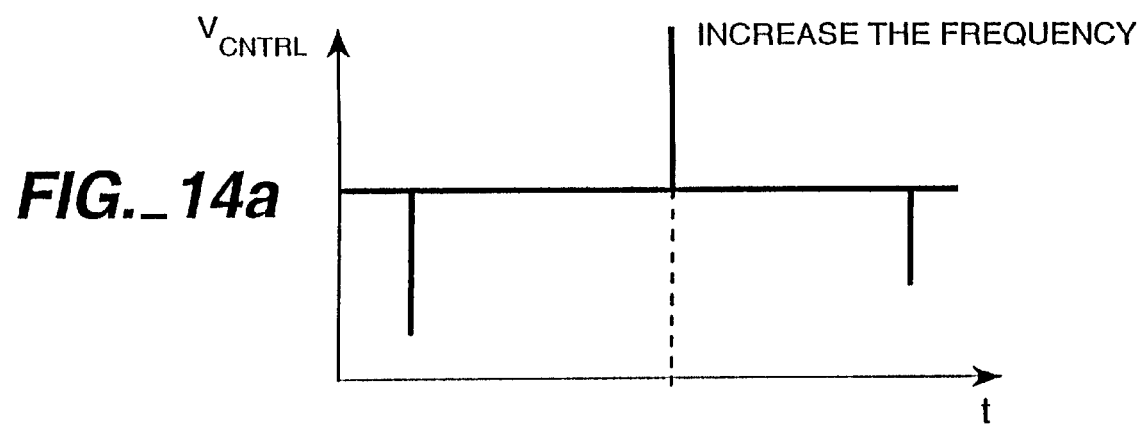
FIG._14a
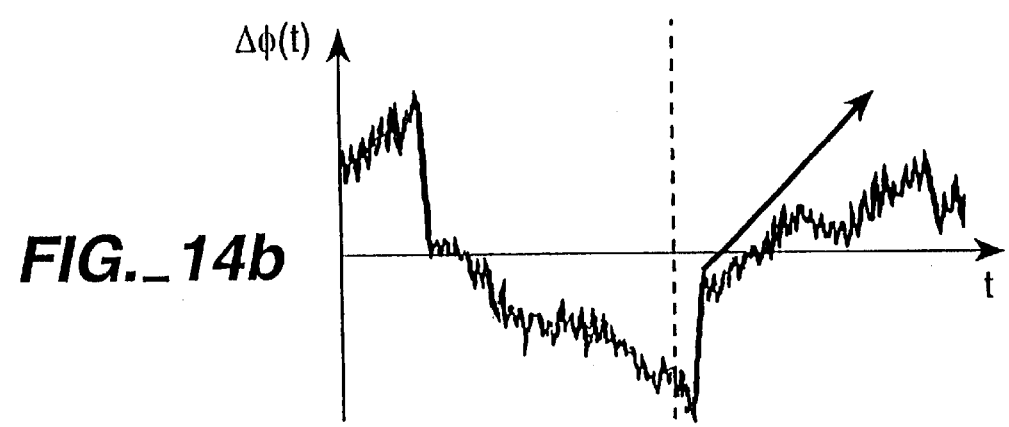
FIG._14b

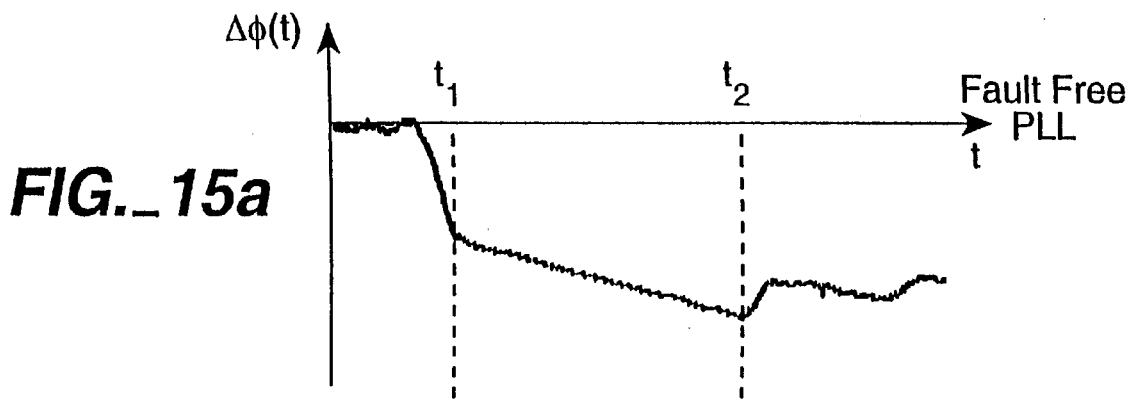
FIG._15a
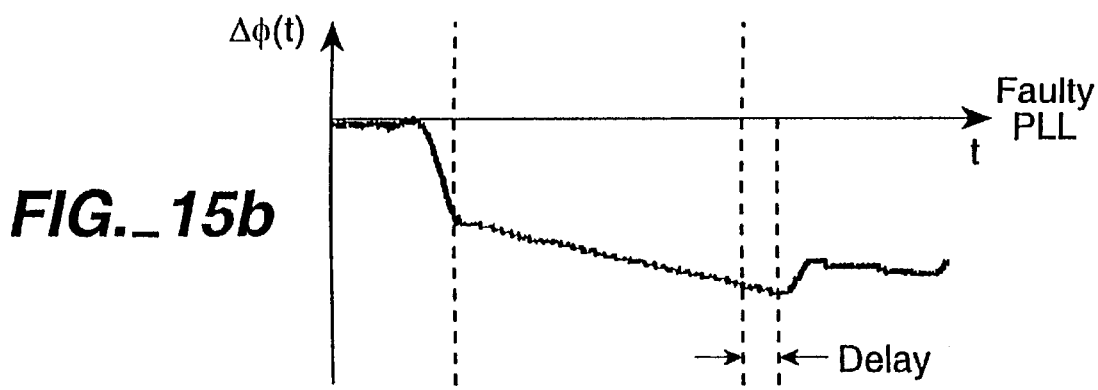
FIG._15b
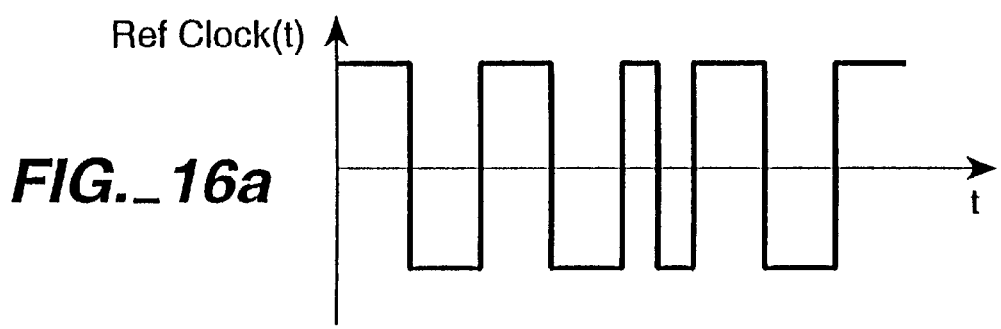
FIG._16a
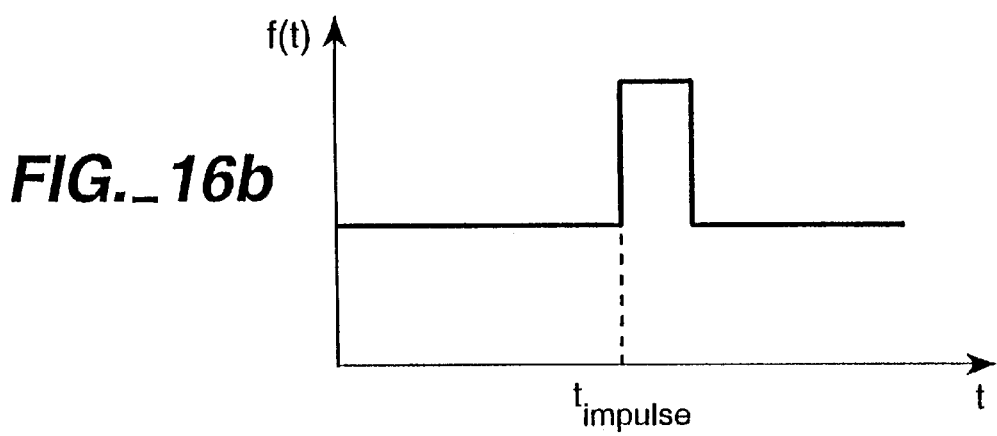
FIG._16b

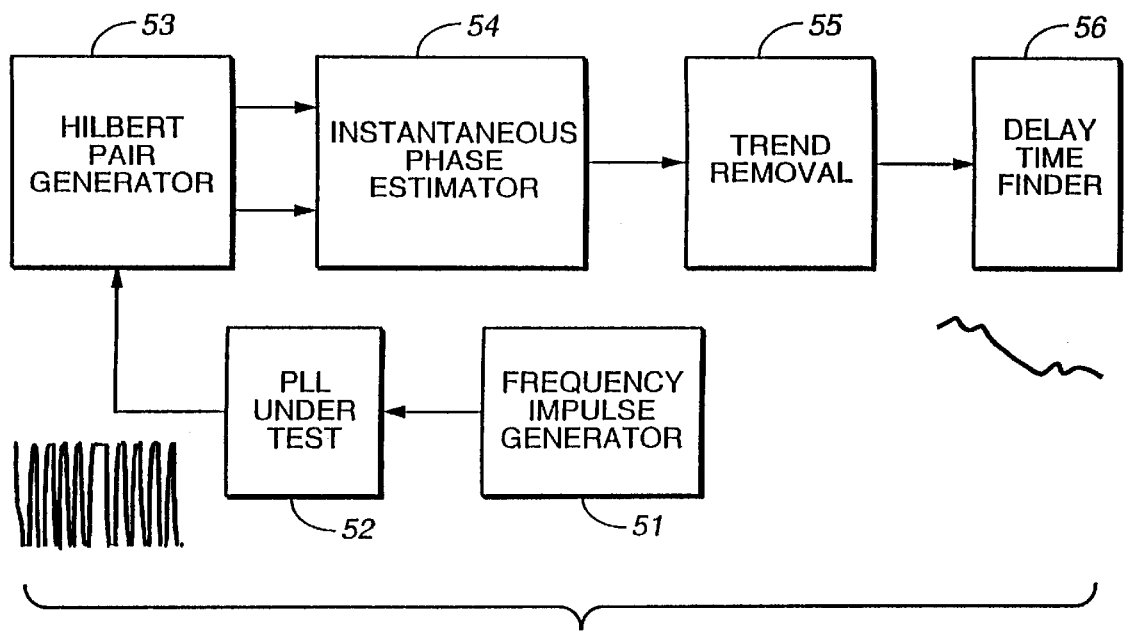
FIG._17
| PARAMETERS | nMOS | pMOS | UNIT |
|---|---|---|---|
| $V_{TO}$ | 0.7386893 | -0.9160475 | V |
| $t_{OX}$ | 135.23 | 134.216 | A |
| XL | -0.0672454 | -0.0287155 | μm |
| XW | -0.166238 | -0.200027 | um |
| RSH | 64.7204 | 117.086 | Ω/[] |
FIG._18

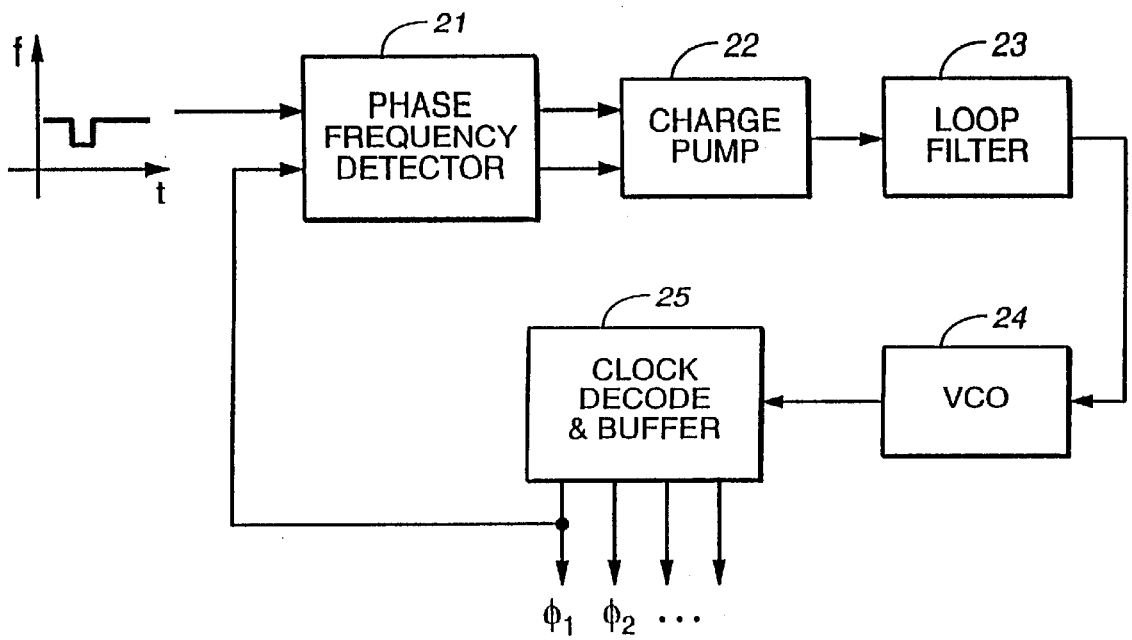
FIG._19
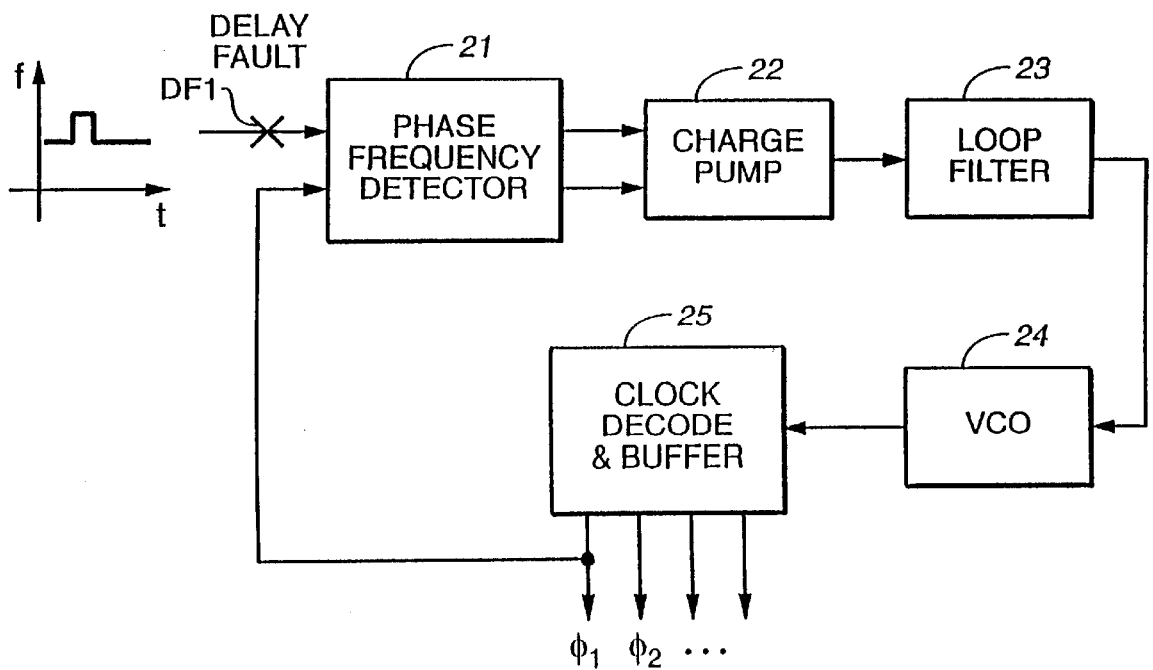
FIG._22

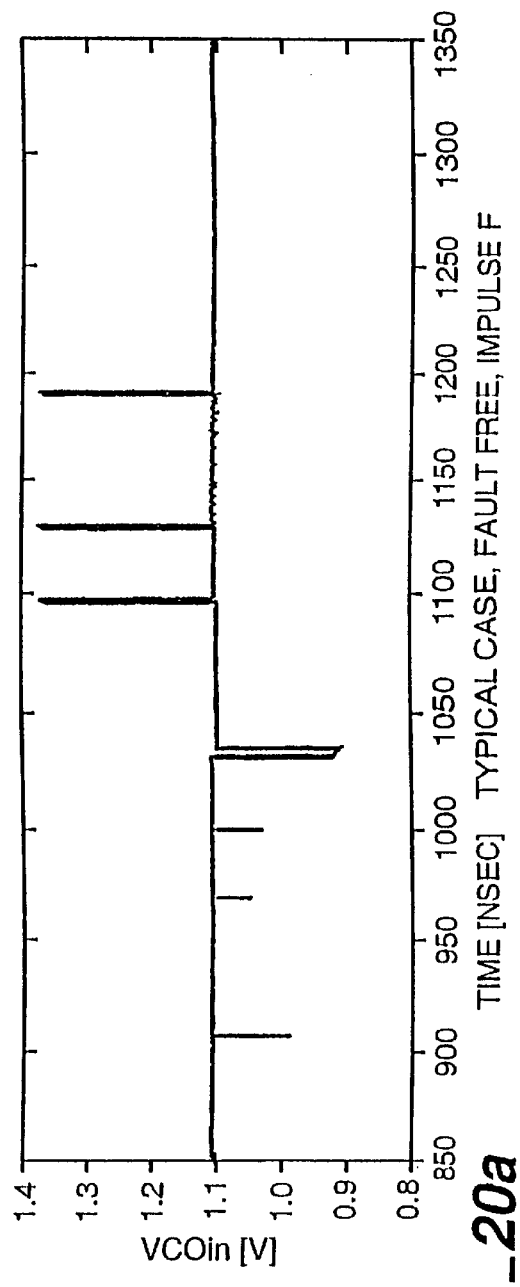
FIG._20a
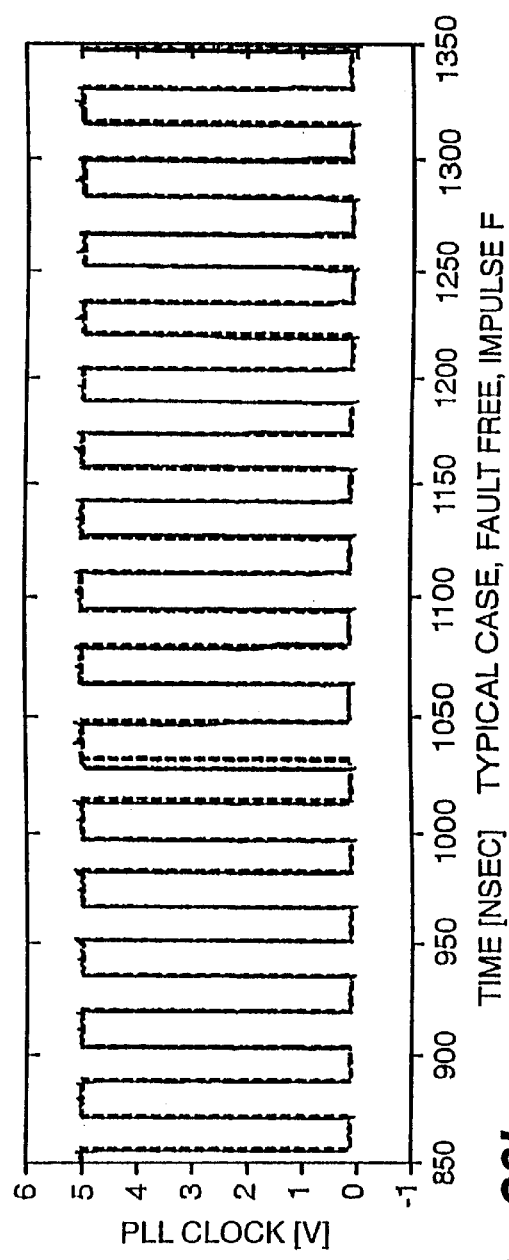
FIG._20b

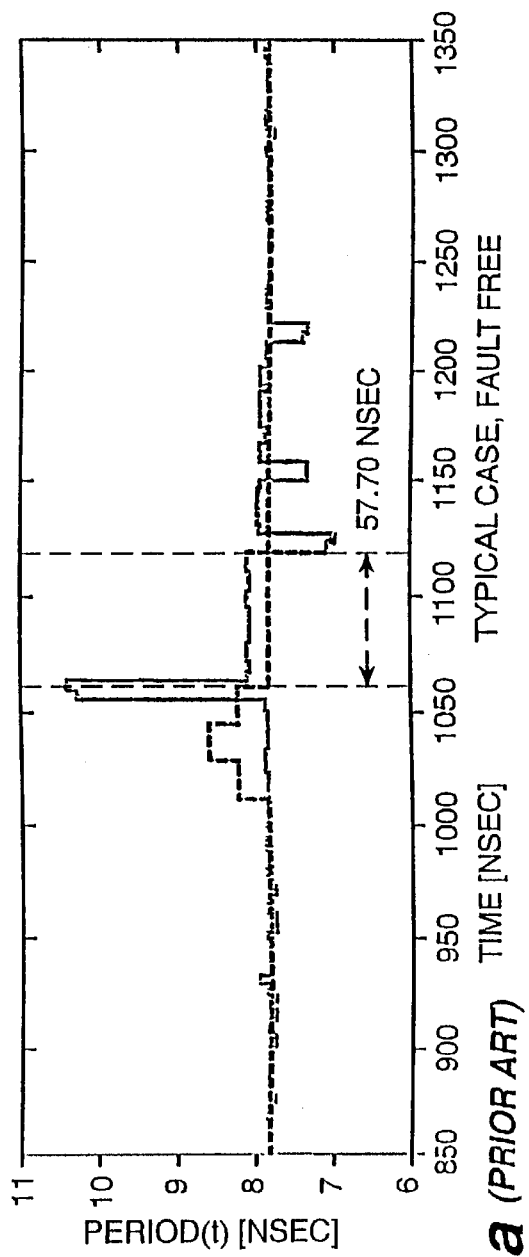
FIG._21a *(PRIOR ART)*
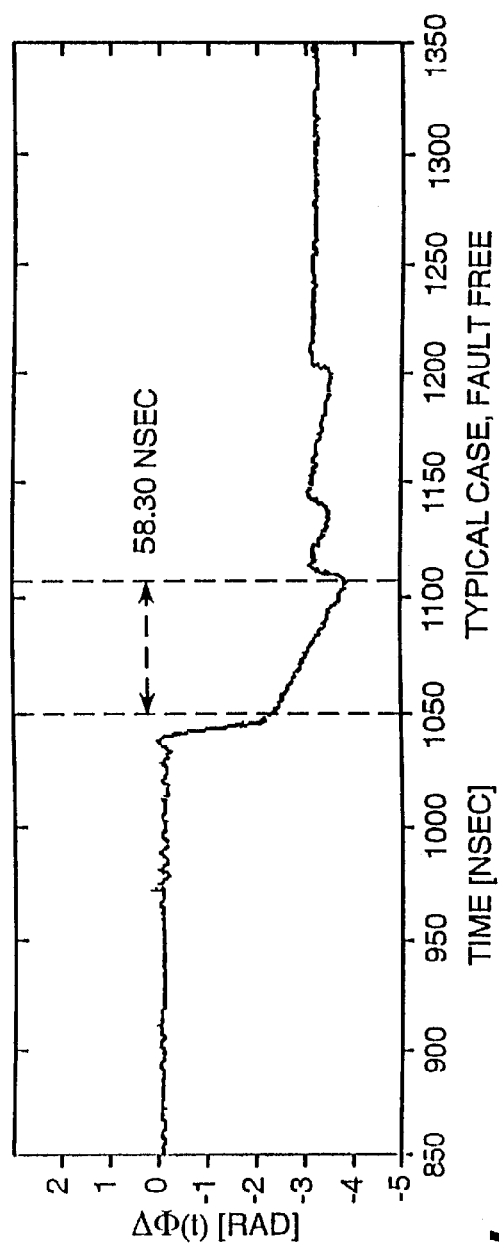
FIG._21b

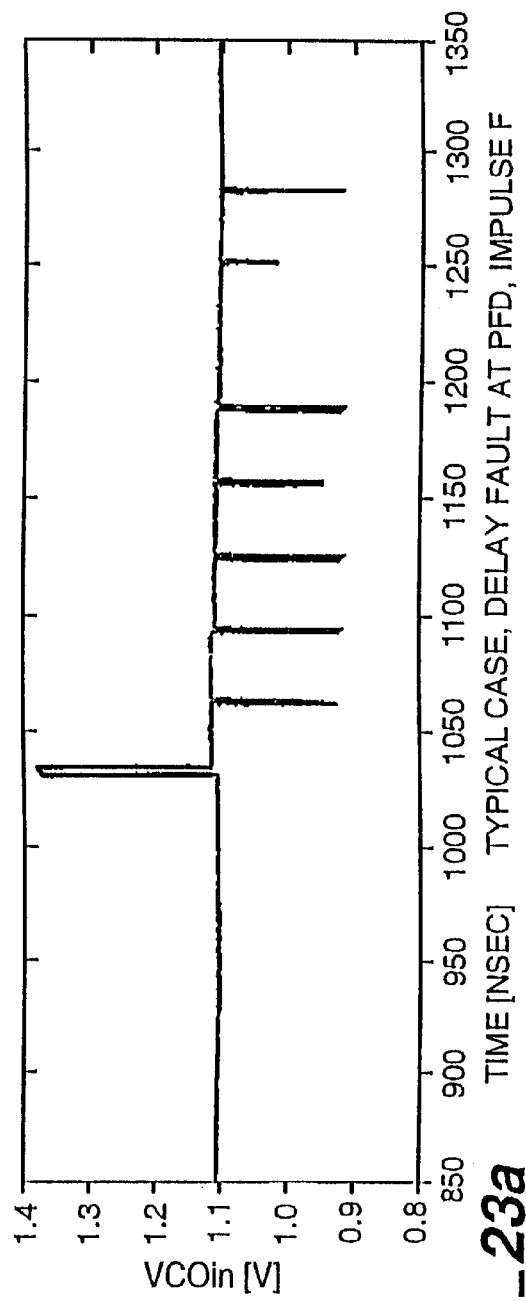
FIG._23a TYPICAL CASE, DELAY FAULT AT PFD, IMPULSE F
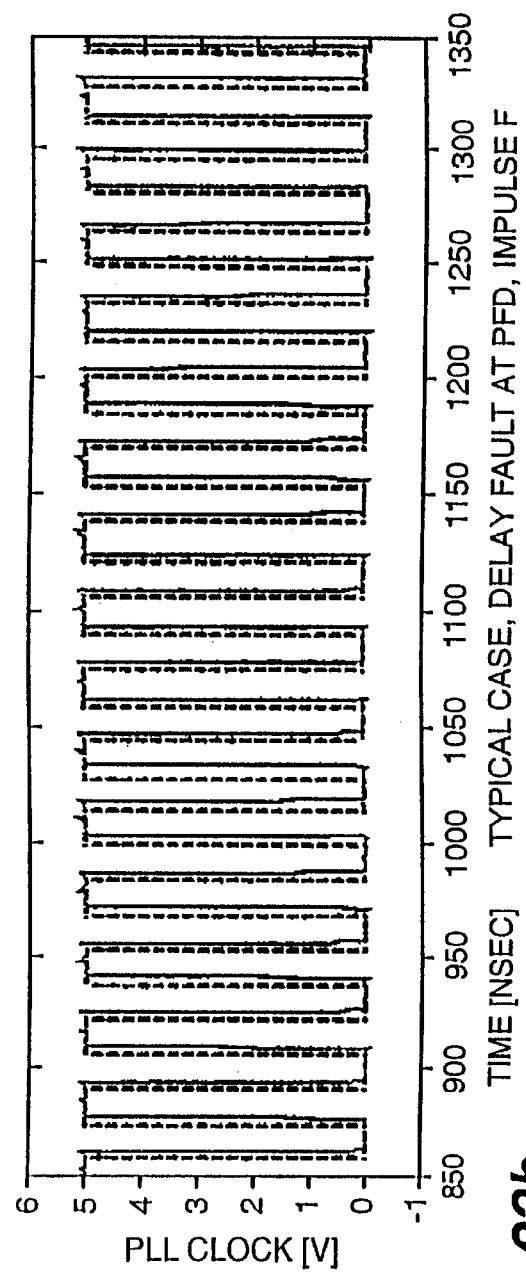
FIG._23b TYPICAL CASE, DELAY FAULT AT PFD, IMPULSE F

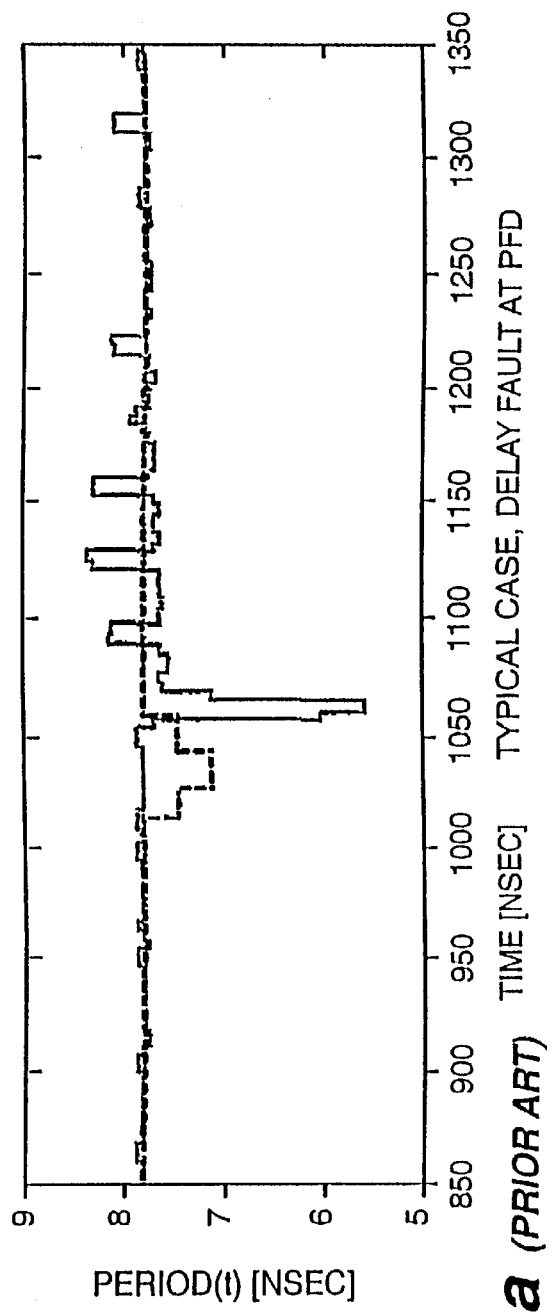
FIG._24a *(PRIOR ART)*
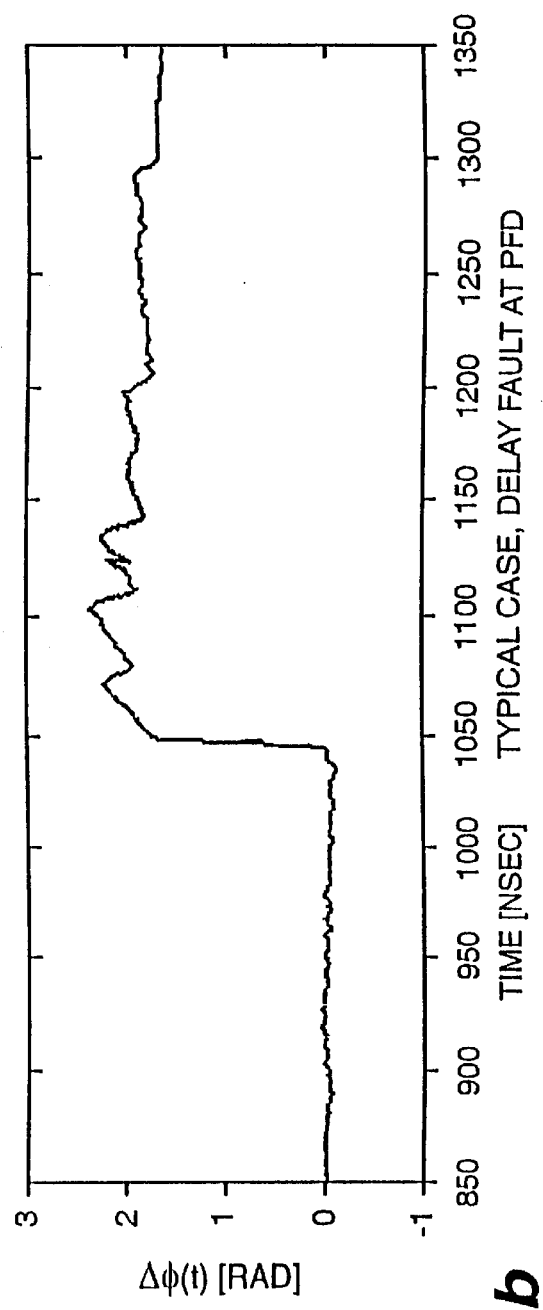
FIG._24b

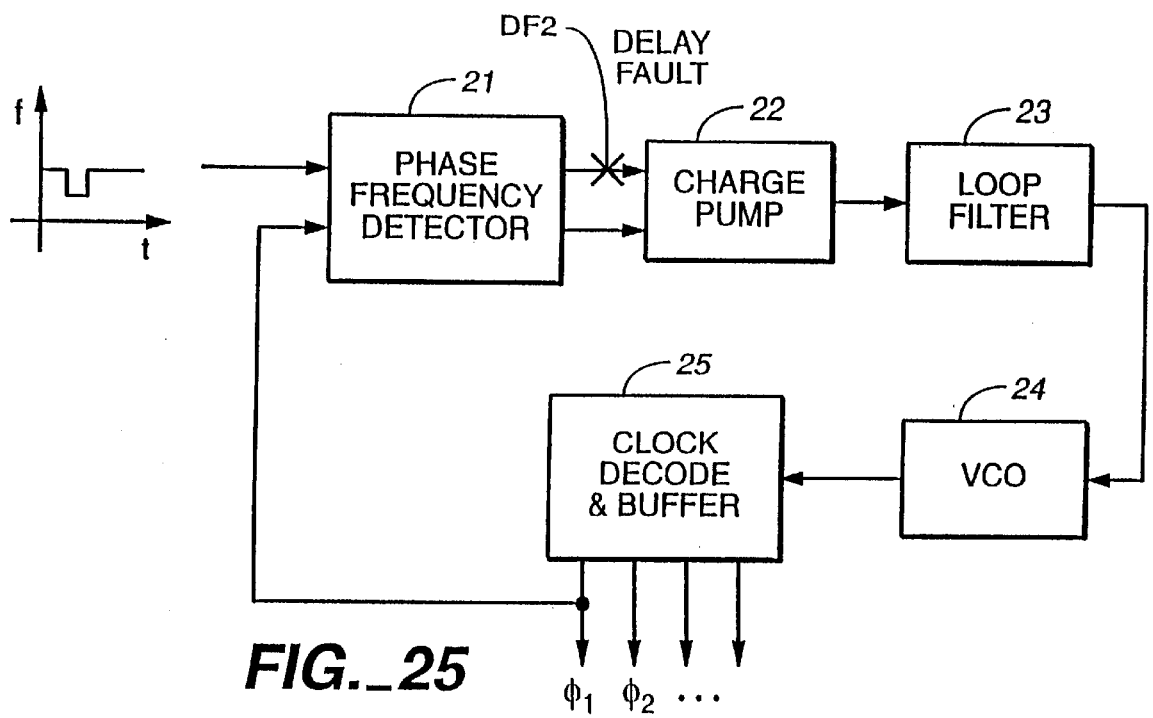
FIG._25
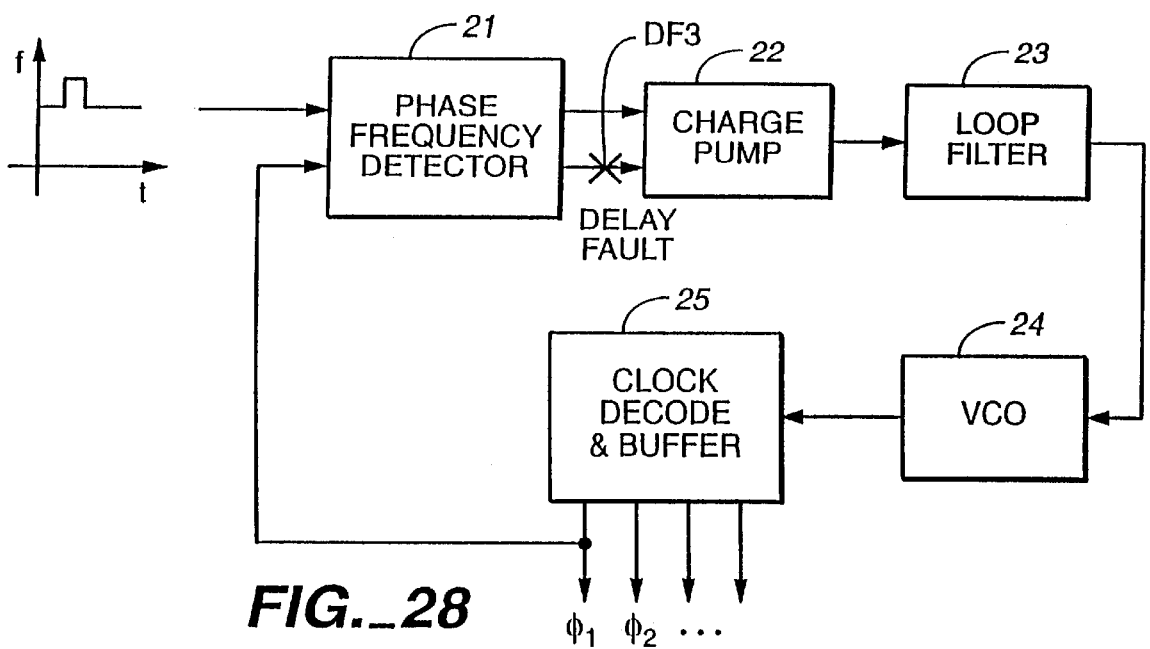
FIG._28

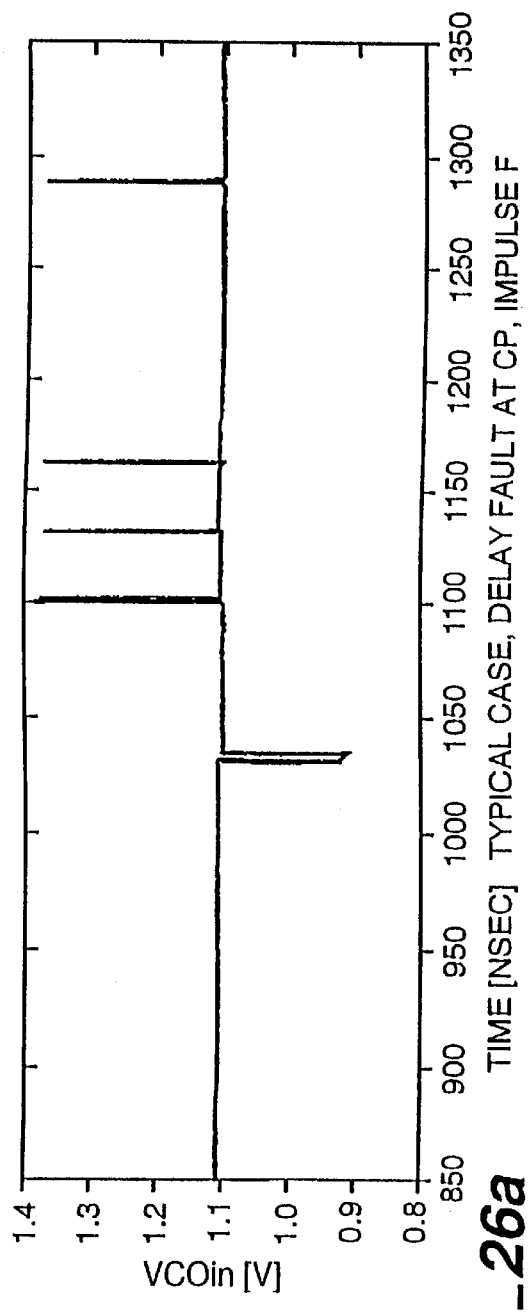
FIG._26a
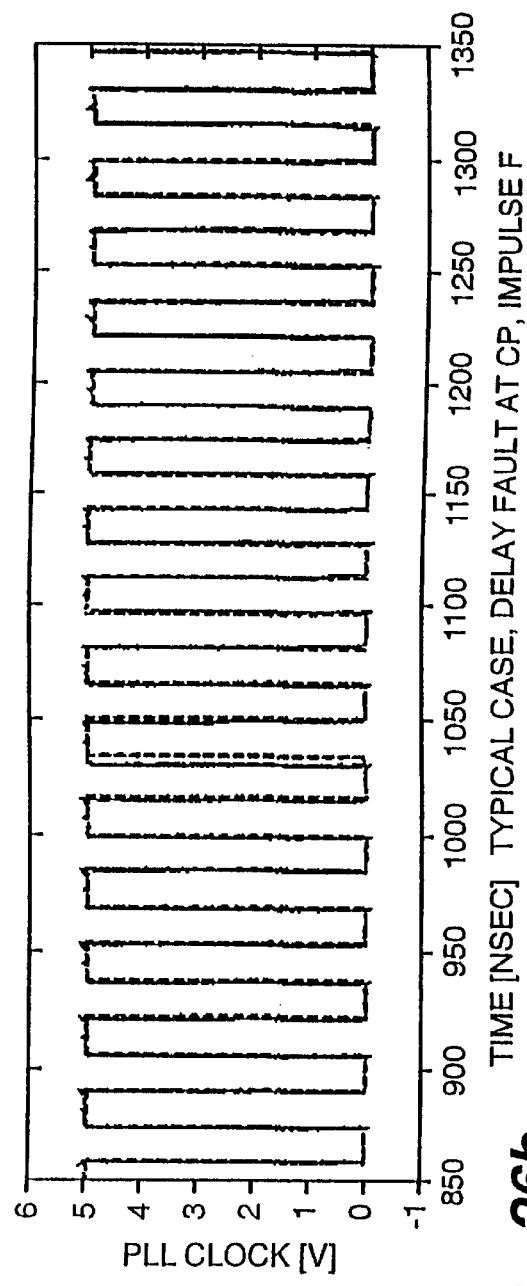
FIG._26b

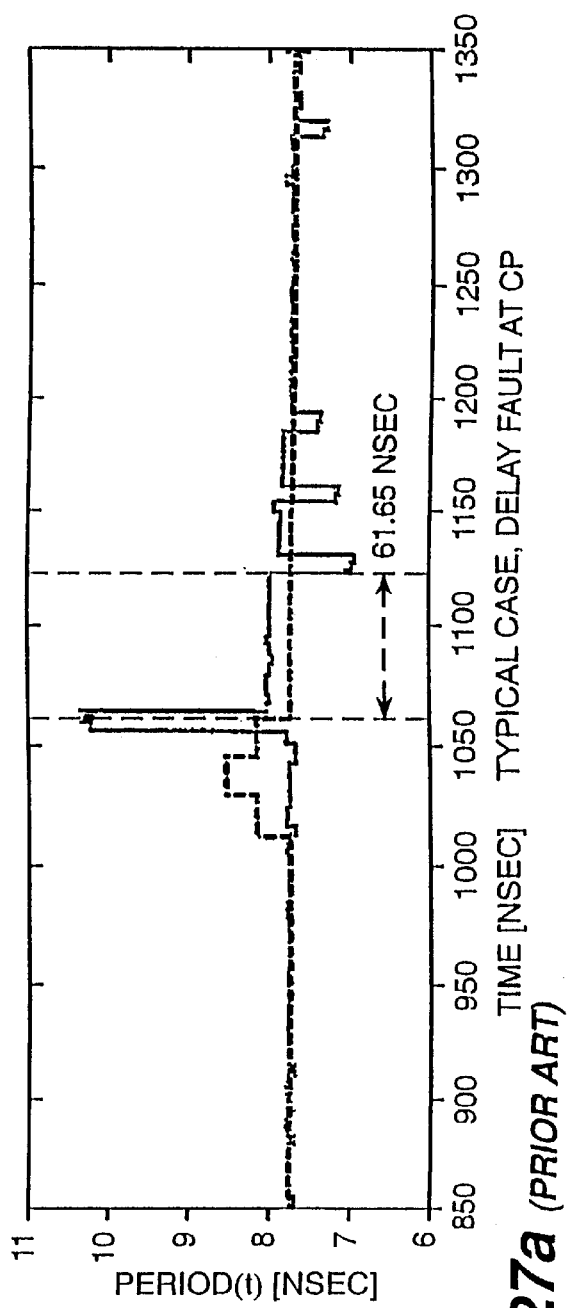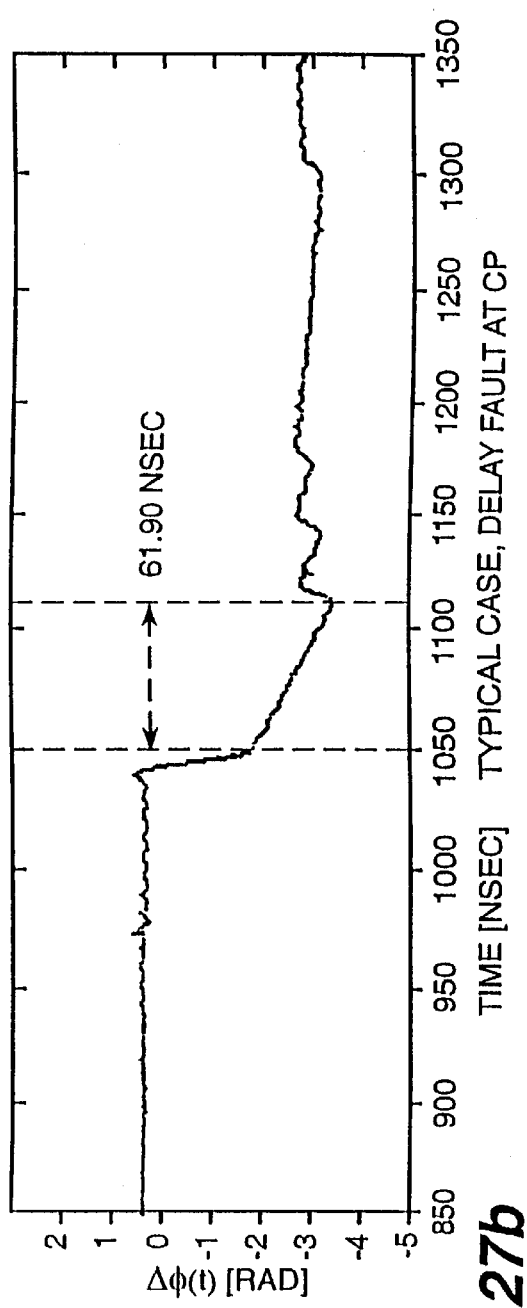
FIG._27a (PRIOR ART)
FIG._27b

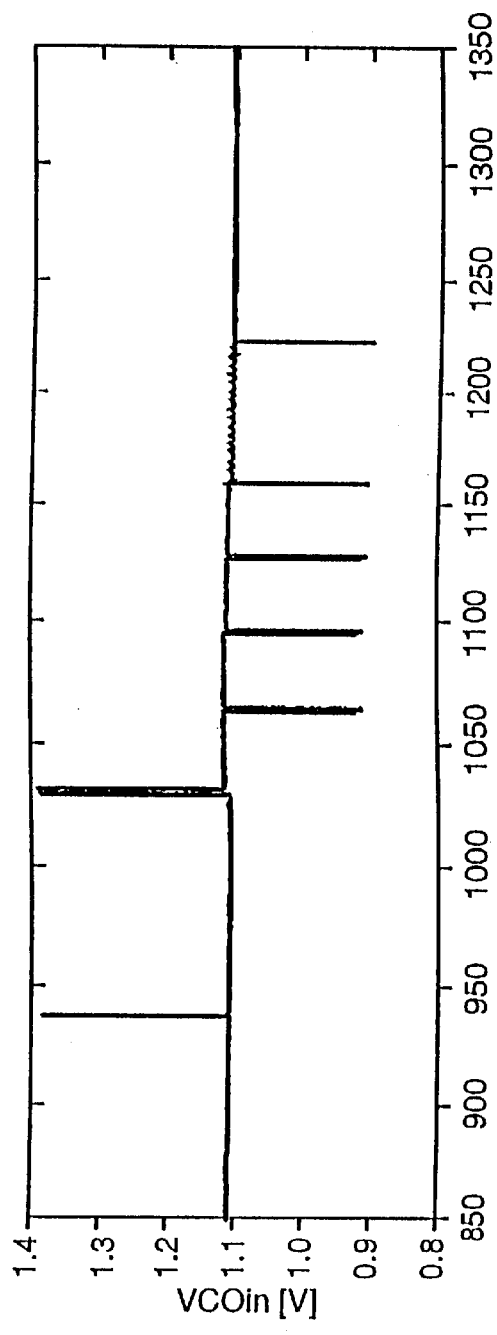
FIG._29a
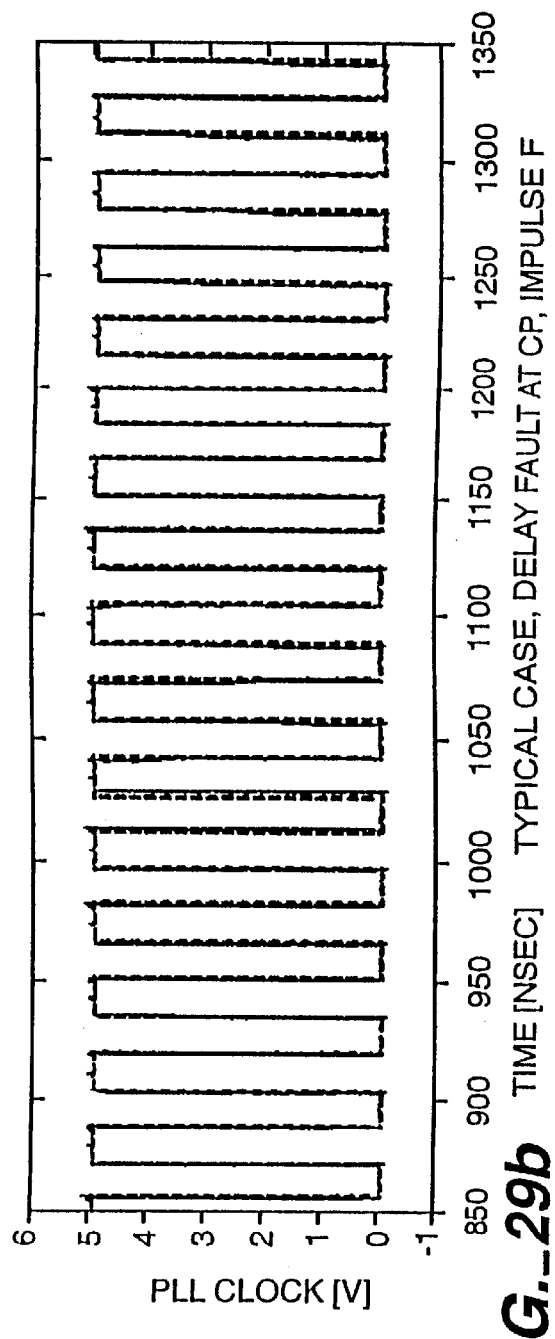
FIG._29b

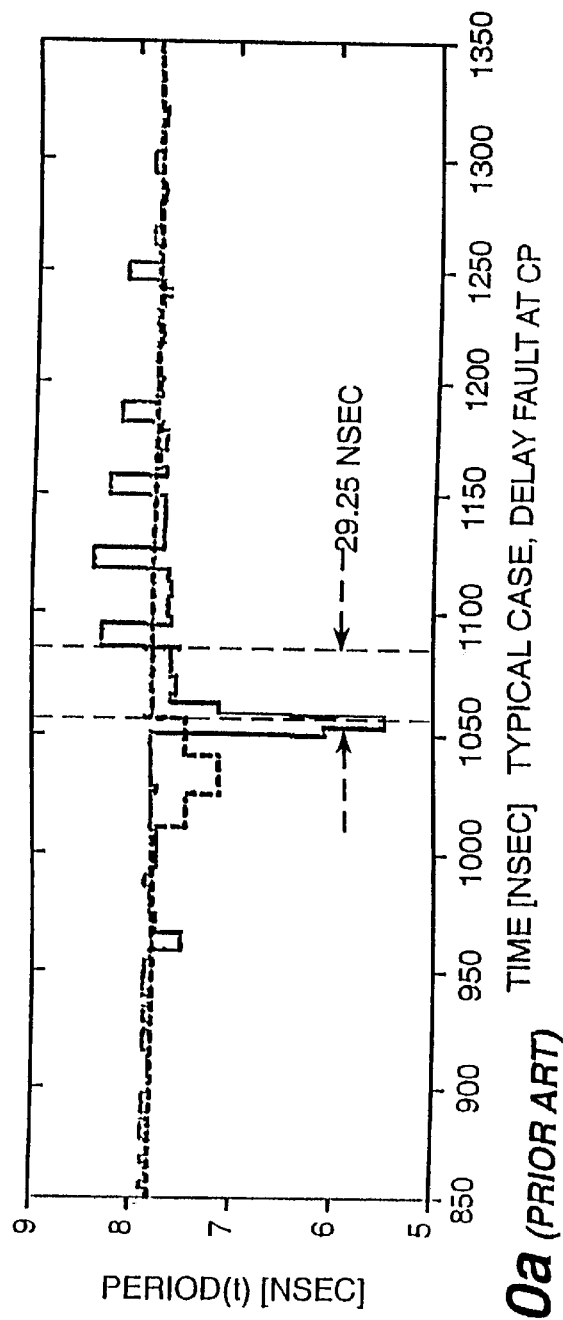
FIG._30a *(PRIOR ART)*
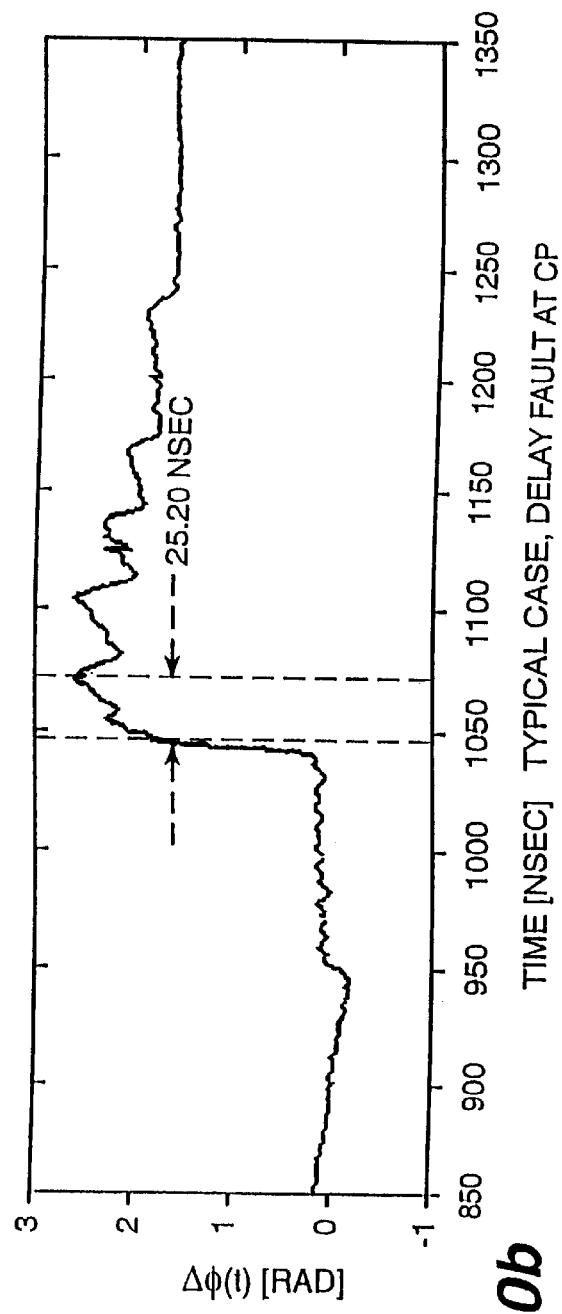
FIG._30b

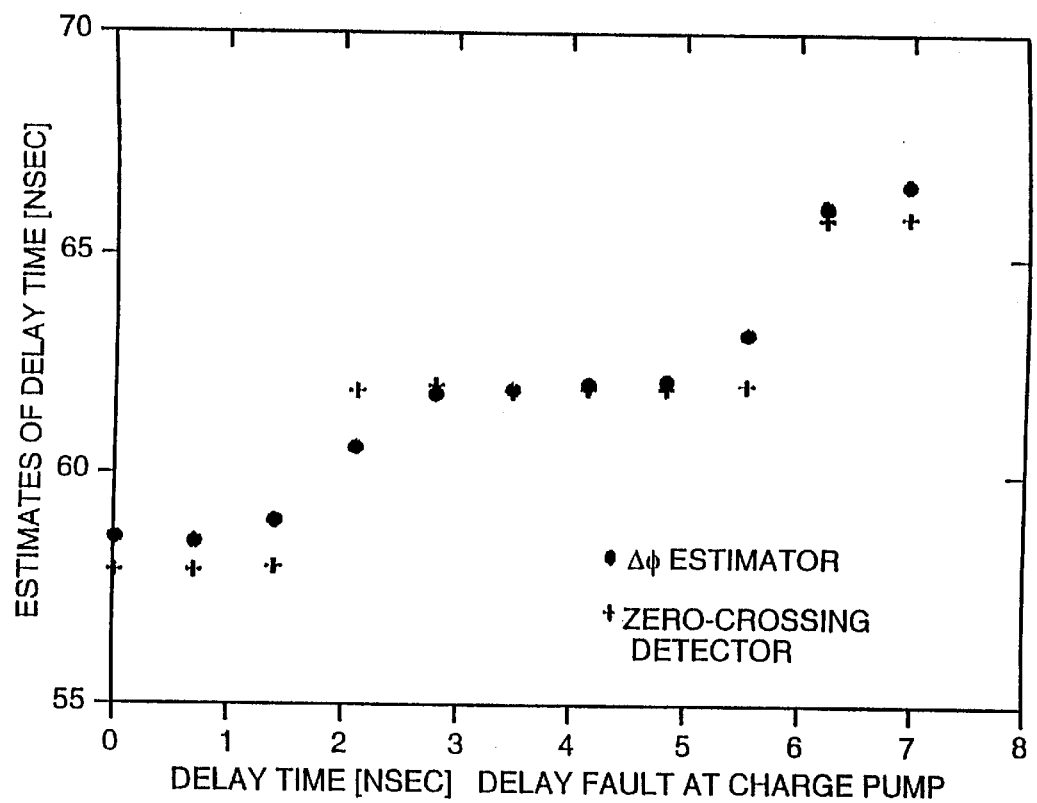
FIG._31
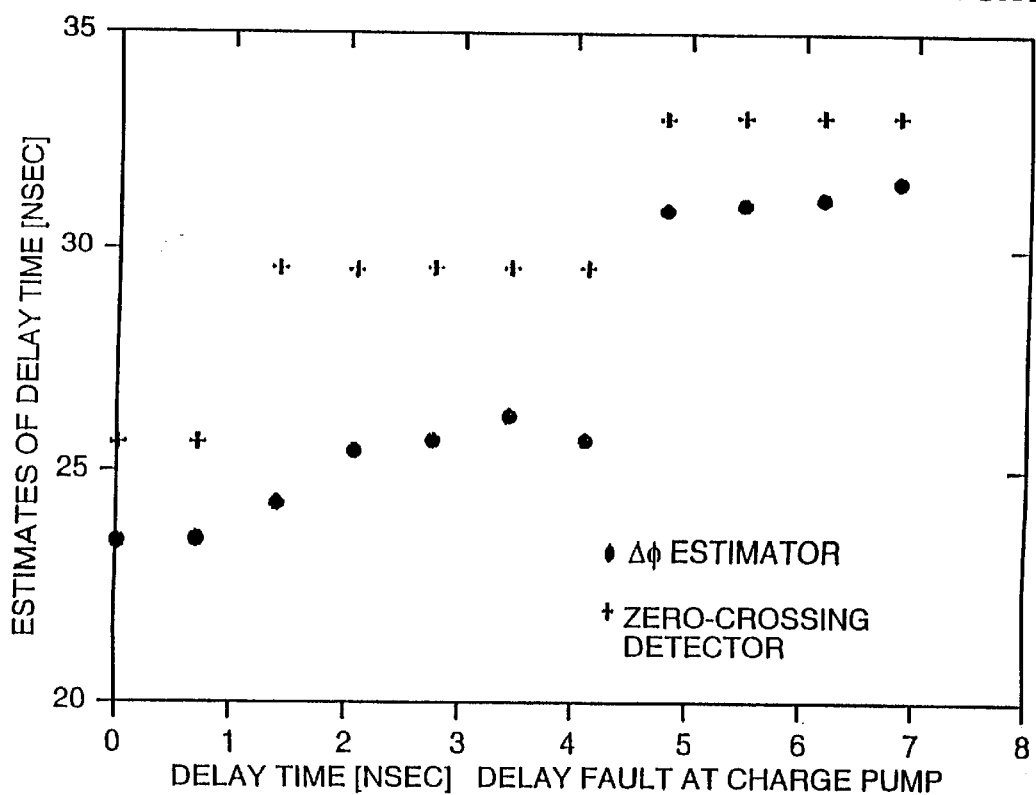
FIG._32

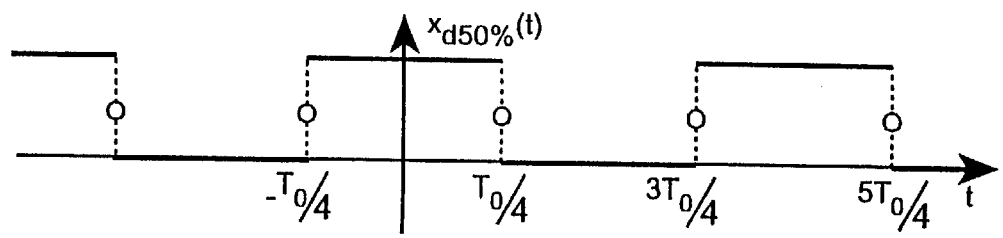
FIG. 34
FIG. 35(a)
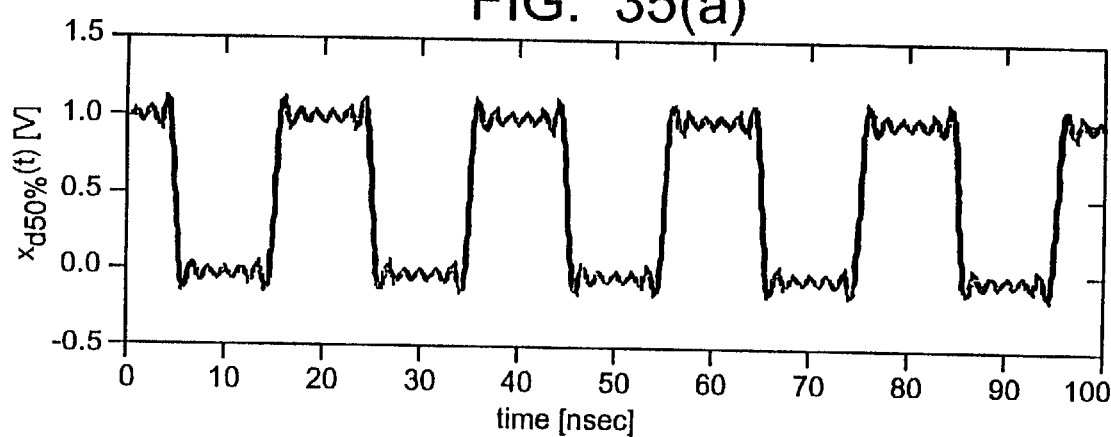
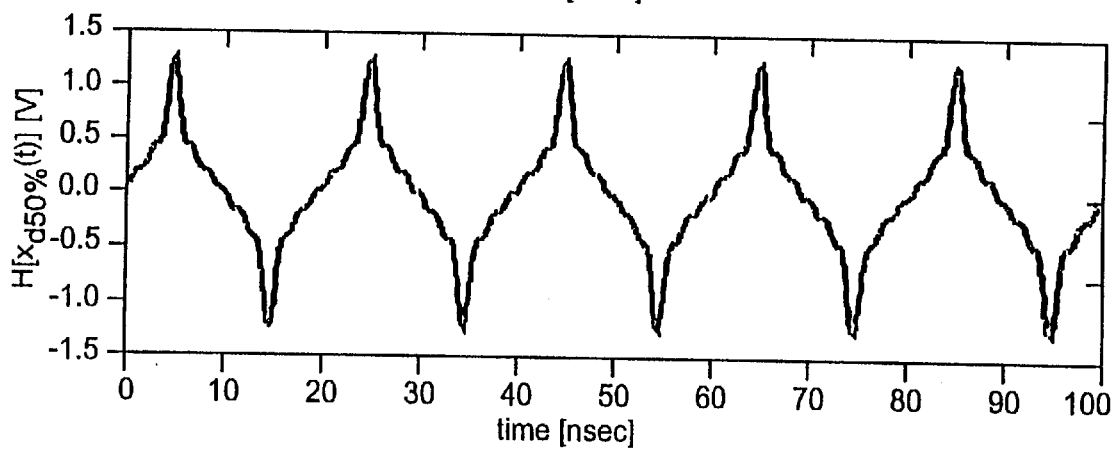
FIG. 35(b)

APPARATUS FOR AND METHOD OF DETECTING A DELAY FAULT IN A PHASE-LOCKED LOOP CIRCUIT

CROSS-REFERENCE TO RELATED APPLICATIONS

This application is a continuation-in-part of copending U.S. patent application Ser. No. 09/251,096, filed Feb. 16, 1999.

BACKGROUND OF THE INVENTION

1. Field of the Invention

The present invention relates to an apparatus for and a method of detecting delay fault in a phase-locked loop circuit, and more particularly, relates to a delay fault detecting apparatus and a delay fault detecting method each of which is suitable for detecting a delay fault in a phase-locked loop (hereinafter referred to as PLL) circuit formed on VLSI (very large scale integrated circuit) chip.

2. Description of the Related Art

A synchronous system performs a cooperative operation by sharing a timing of a clock edge with one another. When a timing of the shared edge is controlled in higher precision, the synchronous system can operate at a higher frequency. FIG. 1 shows an example of the synchronous system. This system is configured such that a plurality of (in this example, two) VLSI chips 11 and 12 are placed on a single board (not shown). A reference clock $\phi$ is supplied to each of the VLSI chips 11 and 12 from a high precision oscillator (for example, a crystal-based clock generator) 13 provided on the board. In PLL circuits 14 and 15 on these VLSI chips, as shown in FIG. 2, clocks $\phi_{11}$, $\phi_{12}$, and $\phi_{21}$, $\phi_{22}$ generated by the on-chip clock generators are synchronized with the externally supplied reference clock $\phi$ and are distributed to subsystems 16 and 17, respectively. (For example, refer to a reference literature d1.)

As described above, by synchronizing the edge of an internal clock with respect to the edge of a reference clock, data can be sent and received freely between different chips. By aligning the frequency and the phase of an oscillation waveform of a voltage-controlled oscillator (hereinafter referred to as VCO) with respect to the frequency and the phase of the external reference clock $\phi$, the PLL circuits 14 and 15 play a role in minimizing a clock skew and ensuring a high speed operation of the system.

As is well known, in a microcomputer, the worst case uncertainty in the instantaneous value (a peak-to-peak jitter or the like) of the clock signal determines the operating frequency of the microcomputer. Accordingly, it is necessary in the microcomputer to surely detect, by testing, such a delay fault that manifest itself as a transient clock skew.

Next, an influence of delay faults in PLL circuits on a system will be discussed. FIG. 3 shows an example of the PLL circuit. This PLL circuit comprises a phase-to-frequency (phase-frequency) detector 21, a charge pump circuit 22, a loop filter 23, a VCO 24, and a clock decode and buffer circuit 25. Now, it is assumed that a delay fault DF1 is present at the reference clock input of the phase-frequency detector 21. As shown in FIG. 4, a reference clock $\phi_{REF}$ (indicated by a solid line) applied to the reference clock input of the phase-to-frequency detector 21 of the PLL circuit becomes a skew clock $\phi$ (indicated by a dotted line) which has been delayed by a constant time period due to the delay fault DF1 present at the reference clock input, and is fed into the charge pump circuit 22 of the next stage. In the PLL circuit, an edge of an internal clock $\phi_1$ (indicated by a solid line) is synchronized with respect to the edge of the dotted line clock $\phi$ which has been delayed by the constant time period. As a result, a clock skew occurs in response to the delay fault DF1. Moreover, the clock skew which is a deviation generated at the reference clock input is not compensated in the PLL circuit and is continued to be held at a constant value. As a result, it appears that a large steady-state deviation remains.

Since this delay fault DF1 is not a fault of an internal block (internal component) of the PLL circuit, the PLL gets into a synchronous state. Accordingly, it is difficult to detect a delay fault at the reference clock input by testing the internal blocks of the PLL circuit. However, a delay fault of this type can easily be detected by comparing the external reference clock $\phi_{REF}$ with the internal clock $\phi_1$.

Next, as shown in FIG. 5, it is assumed that a delay fault DF2 is present at the Up signal input of the charge pump circuit 22. Due to this delay fault DF2, a timing in the charge pump circuit 22 for converting an Up signal outputted from the phase-frequency detector 21 into an analog signal to output the converted analog signal is delayed. Moreover, the delay of the analog signal brings about a timing delay of an oscillation of the VCO 24. In the next step, the phase-frequency detector 21 compares the edge of the reference clock $\phi_{REF}$ with the edge of the internal clock $\phi_1$, and controls the timing of the oscillating frequency of the VCO 24 by using a phase error signal the height of which is proportional to the time interval between the rising edges of these two clock signals. The feedback control is continued until the rising edges of both the clock signals are aligned with each other. Therefore, this delay fault DF2 appears simultaneously with a state transition and is compensated by the feedback. The delay time is maximized immediately after the state transition. Therefore, as shown in FIG. 6, a clock skew is also maximized immediately after the state transition, and it is decreased to zero in multiple consecutive cycles, because a PLL circuit is a feed back system as mentioned above. Thus, a transient skew occurs. Since a time during which a skew occurs is limited, it is hard to detect the transient skew by testing.

As discussed above, when a delay fault DF1 is present at the reference clock input of the phase-frequency detector 21, a clock skew having constant time duration occurs. This clock skew is not compensated by the PLL circuit. On the other hand, when a delay fault DF2 is present at the Up signal input of the charge pump circuit 22, a large transient clock skew appears associated with a state transition shown in FIG. 7. This transient clock skew caused by the delay fault DF2 is compensated by the PLL circuit and approaches to zero. It is to be noted that all of the delay faults in the remaining blocks (in the input end of the loop filter 23 and in the input end of the VCO 24) of the PLL circuit can be mapped to the delay fault in the input end of the charge pump circuit 22.

A stuck-at fault testing (for example, refer to a reference literature d2) has conventionally been utilized most widely in the verification test and the manufacturing test of VLSI chips. First, the stuck-at fault testing will briefly be explained.

A fault model is a model in which a physical defect is abstracted. When the fault model is used, the operation of a circuit in the presence of faults can easily be simulated using a computer. For example, a state in which an output of a CMOS (complementary metal-oxide semiconductor) inverter keeps taking a logical value "1" can be explained by using a model in which a stuck-at 1 fault is present in the output of the inverter. As a cause of the fault of this type, there can be considered a short-circuit defect between the output of the inverter and the power supply line of $V_{DD}$ or a physical open defect that breaks a drain of an nMOS (n-channel metal-oxide semiconductor).

In the testing, a test pattern is applied to primary inputs of a circuit under test and a response pattern of the circuit appearing at primary outputs of the circuit under test is observed. By comparing the response pattern with an expected value pattern in fault-free operation, whether the circuit is faulty or not is checked. FIG. 8 shows a combinational circuit of a NAND gate ND1 having no stuck fault and a NAND gate ND2 having a stuck-at 0 fault (s-a-0). The outputs of both the NAND gates ND1 and ND2 are taken out through an OR gate OR1 as a primary output.

A test pattern which can detect the stuck-at 0 fault in the combinational circuit shown in FIG. 8 is "110". That is, as shown in FIG. 8, it is this test pattern "110" that is applied to the primary inputs of the combinational circuit. When the test pattern "110" is applied to the primary inputs of the combinational circuit, if it is fault-free, the primary output of the combinational circuit becomes "1". On the other hand, if the combinational circuit is faulty, the primary output thereof is "0". Hence, by applying the test pattern "110" to the combinational circuit, it is possible to identify whether a fault is present in the combinational circuit under test or not. Further, when the value of the test pattern is carefully observed, it can be seen that this test pattern is generated such that it takes a complementary logical value "1" at the site of the stuck-at 0 fault.

The rapid development of processing technology is pushing integrated circuit (IC) into deep submicron so that wire delays (each caused by a signal wire when a signal propagates along the signal wire) are more significant than gate delays (each caused by a gate element when a signal propagates through the gate element). As a result, delay fault testing has begun to be used in testing of microprocessors (for example, refer to reference literature d3). Next, a conventional delay fault testing method will briefly be explained (for example, refer to a reference literature d4).

Two fault models have been proposed for delay faults, one of which is a gate delay fault and the other of which is a path delay fault. A circuit is said to have a gate delay fault if a time taken by a signal propagating through a gate in the circuit exceeds the specified worst propagation delay value. Similarly, a circuit is said to have a path delay fault if a time taken by a signal propagating along a signal path in the circuit exceeds the specified worst propagation delay value.

The delay fault testing requires two-pattern tests. FIG. 9 shows an example of the delay fault testing. The illustrated circuit under test is a combinational circuit which comprises first, second and third NAND gates ND1, ND2 and ND3 configured such that the outputs of the first and the second NAND gates ND1 and ND2 are fed into the third NAND gate ND3. First, an initializing pattern $V_1$ is applied, using a slow clock, to primary inputs of the circuit under test. This initializing pattern $V_1$ in this example is "1111". The reason for using a slow clock is that a delay fault does not affect the state transition, if its cycle time is long enough to allow all transitions in the circuit to settle. After the circuit under test has entered into an initial state, a test pattern $V_2$ is applied to the primary inputs of the circuit under test using a fast clock. This test pattern $V_2$ in this example is "0101". Thus, as seen on the drawing of FIG. 9, the upper lead of the two input leads of the first NAND gate ND1 (the input lead to which "0" of the test pattern $V_2$ is applied), the upper lead of the two input leads of the second NAND gate ND2 (the input lead to which "0" of the test pattern $V_2$ is applied), and the signal lines from the outputs of the first and second NAND gates ND1 and ND2 to the inputs of the third NAND gate ND3 are activated. Pulses corresponding to the test pattern $V_2$ propagate through these leads and signal lines. As a result, each pulse appears at the primary output of the circuit under test (the output of the third NAND gate ND3) correspondingly to the propagation delay time. This outputted final value is captured into an output latch which is clocked by the fast clock. The latched value is used to determine whether or not a delay fault is present in the circuit under test. Usually, a system clock is used as the fast clock. FIG. 10 shows a concept of the delay fault testing described above. Input latches 31 and output latches 32 are connected to the front stage and the rear stage of the circuit under test (combinational circuit) 30, respectively.

It is very difficult to generate test patterns for a delay fault testing. The reason is that in order to detect the target delay fault independently of a delay time and all other delay faults located in a circuit, the following condition must be satisfied. That is, both "the on-path input pulse propagating through the activated line under test" and "the off-path sensitizing input pulses propagating through the side-input lines which are joining to the line under test" must be glitch free (for example, refer to a reference literature d5). For this reason, the conventional delay fault testing method generates test patterns for only a small number of signal lines, and hence can detect only a limited number of delay faults present in the circuit.

As VLSI circuits grow more and more in size and complexity, it becomes more difficult to align all the clock edges within a chip with respect to the reference clock edge and to distribute the clock signal with a minimum skew. For this reason, for example, an algorithm called H-tree configuration is introduced into the layout design of a clock-distribution network (wiring for distributing the clock signal). A curve called H-tree is a Hilbert curve shown in FIG. 11 (for example, refer to reference literature d6). Since, in the H-tree, all of the cells connected to leaf nodes respectively are equidistant from the clock driver, the clock skew is theoretically zero. Moreover, the Hilbert curve is self-similar and is able to construct a brain structure (three-dimensional wiring layout) (for example, refer to reference literature d7). In addition, the Hilbert curve can be generated easily using a recursive algorithm. An application of the Hilbert curve to the three-dimensional clock-distribution network or the like is an interesting field to study.

As the operation speed or rate of a VLSI circuit is increased more and more, at-speed testing of clock-distribution networks has become more important. However, the conventional delay fault testing method is not suitable for efficiently testing of clock-distribution networks.

It is difficult for the following reasons to test a delay fault in a PLL circuit 40, as shown in FIG. 12, using the aforementioned conventional delay fault testing method. First, (i) when latches are inserted in the PLL circuit 40, an additional skew is incurred in the internal clock of the PLL circuit 40. As a result, a performance penalty is inevitable, which slows down its target operating speed. Next, (ii) in order to latch an internal clock of the PLL circuit, a higher speed clock is necessary. That is, this results in a self-contradiction.

SUMMARY OF THE INVENTION

It is an object of the present invention to provide an apparatus for and a method of detecting a delay fault in a PLL circuit utilizing the slope of an instantaneous phase of an analytic signal.

In order to accomplish the above object, in an aspect of the present invention, there is provided a method of detecting a delay fault in a phase-locked loop circuit, which comprises the steps of: applying a frequency impulse to a phase-locked loop circuit to cause a state transition of the phase-locked loop circuit; estimating, from a signal outputted from the phase-locked loop circuit, an instantaneous phase of the signal; and measuring, from the fluctuation term of the instantaneous phase, a time duration during which the phase-locked loop circuit stays in a state of oscillating a certain frequency.

In a preferred embodiment, the aforesaid step of estimating an instantaneous phase includes the steps of: transforming a waveform of the output signal from the phase-locked loop circuit to an analytic signal; and estimating an instantaneous phase of the analytic signal, and the aforesaid step of measuring a time duration includes the step of: detecting a delay fault by comparing a time duration during which the phase-locked loop circuit stays in a state of oscillating a certain frequency with a time duration during which a fault-free phase-locked loop circuit having no delay fault present therein stays in a state of oscillating a certain frequency.

In addition, the aforesaid step of measuring a time duration is a process of estimating a time duration from a changing portion of the slope of the instantaneous phase.

In another aspect of the present invention, there is provided an apparatus for detecting a delay fault in a phase-locked loop circuit, which comprises: frequency impulse applying means for applying a frequency impulse to a phase-locked loop circuit under test as the reference clock signal; transform means for transforming the waveform of a signal outputted from the phase-locked loop circuit under test to an analytic signal; estimating means for estimating an instantaneous phase of the analytic signal; and delay time measuring means for measuring a delay time from the fluctuation term of the estimated instantaneous phase.

In a preferred embodiment, the aforesaid transform means is a Hilbert pair generator, and further, there is provided means for estimating a linear phase from the estimated instantaneous phase and removing the estimated linear phase from the estimated instantaneous phase to obtain a fluctuation term of the instantaneous phase.

In addition, the aforesaid delay time measuring means may be means for detecting a delay fault by comparing a time duration during which the phase-locked loop circuit stays in a state of oscillating a certain frequency with a time duration during which a fault-free phase-locked loop circuit having no delay fault present therein stays in a state of oscillating a certain frequency.

Alternately, the aforesaid delay time measuring means may be means for estimating a time duration from a changing portion of the slope of said instantaneous phase.

In a still another aspect of the present invention, there is provided a method of detecting a delay fault in a phase-locked loop circuit, which comprises the steps of: applying a frequency impulse to a phase-locked loop circuit to cause a state transition of the phase-locked loop circuit; estimating, from a signal outputted from the phase-locked loop circuit, an instantaneous period of the signal; and measuring, from the instantaneous period, a time duration during which the phase-locked loop circuit stays in a state of oscillating a certain frequency.

In a preferred embodiment, the aforesaid step of measuring a time duration is a step of measuring a time duration from a time point at which the input frequency impulse is returned to its original state until a time point at which the instantaneous period of the output signal from the phase-locked loop circuit suddenly changes.

In a further aspect of the present invention, there is provided an apparatus for detecting a delay fault in a phase-locked loop circuit, which comprises: frequency impulse applying means for applying a frequency impulse to a phase-locked loop circuit under test as the reference clock signal; estimating means for estimating, from a signal outputted from the phase-locked loop circuit, an instantaneous period of the signal; and delay time measuring means for measuring a time duration from the estimated instantaneous period.

In a preferred embodiment, the aforesaid delay time measuring means is means for measuring a time duration from a time point at which the input frequency impulse is returned to its original state until a time point at which the instantaneous period of the output signal from the phase-locked loop circuit suddenly changes.

The above and other objects, constructions, configurations and effects of the present invention will easily become apparent from the following description of the preferred embodiments with reference to the accompanying drawings.

BRIEF DESCRIPTION OF THE DRAWINGS

FIG. 1 is a block diagram showing an example of the synchronous system for minimizing a clock skew using a PLL circuit;

FIG. 2 shows waveforms of clock pulses for explaining the operation of the system shown in FIG. 1;

FIG. 3 is a block diagram showing a PLL circuit having a delay faut present in a phase-frequency detector;

FIG. 4 shows waveforms of clock pulses for explaining the operation of the PLL circuit shown in FIG. 3;

FIG. 5 is a block diagram showing a PLL circuit having a delay fault present in a charge pump circuit;

FIG. 6 shows waveforms of clock pulses for explaining the operation of the PLL circuit shown in FIG. 5;

FIG. 7 is a state diagram of the phase-frequency detector in a PLL circuit;

FIG. 8 is a circuit diagram showing an example of the combinational circuit in which a stuck-at fault is present;

FIG. 9 is a circuit diagram showing an example of the combinational circuit in which a delay fault is present;

FIG. 10 shows a concept for explaining an example of the conventional delay fault testing method;

FIG. 11 is a diagram showing an example of Hilbert curve;

FIG. 12 is a block diagram showing a concept of the conventional delay fault testing method which is applied to a PLL circuit;

FIG. 13 is diagrams showing an analog frequency-Down signal applied to a VCO of a PLL circuit and a corresponding change of a phase noise waveform $\Delta\phi(t)$;

FIG. 14 is diagrams showing an analog frequency-Up signal applied to a VCO of a PLL circuit and a corresponding change of a phase noise waveform $\Delta\phi(t)$;

FIG. 15 shows waveforms for explaining a delay fault detecting method by comparing a phase fluctuation waveform $\Delta\phi(t)$ of a PLL circuit under test with a phase fluctuation waveform $\Delta\phi(t)$ of a fault-free PLL;

FIG. 16 is waveform diagrams showing an example of the frequency impulse signal and a frequency impulse respectively by which a PLL circuit is made to perform a state transition;

FIG. 17 is a block diagram showing a first embodiment of the delay fault detecting apparatus according to the present invention;

FIG. 18 is a characteristic diagram showing parameters of a MOSFET;

FIG. 19 is a block diagram showing a PLL circuit comprised of 0.6-$\mu$m 5-V CMOS technology;

FIG. 20(a) shows an input waveform to a VCO of the PLL circuit shown in FIG. 19;

FIG. 20(b) is a waveform diagram showing an internal clock of the PLL circuit shown in FIG. 19;

FIG. 21(a) is a waveform diagram showing a measurement result obtained by measuring an instantaneous period of an oscillating waveform of the VCO of the PLL circuit shown in FIG. 19 using a zero crossing method according to the present invention;

FIG. 21(b) is a diagram showing a phase fluctuation waveform $\Delta\phi(t)$ estimated by the method according to the present invention;

FIG. 22 is a block diagram showing an example of the PLL circuit having a delay fault which cannot be tested by the method according to the present invention;

FIG. 23(a) shows an input waveform to a VCO of the PLL circuit shown in FIG. 22;

FIG. 23(b) is a waveform diagram showing an internal clock of the PLL circuit shown in FIG. 22;

FIG. 24(a) is a waveform diagram showing a measurement result obtained by measuring an instantaneous period of an oscillating waveform of the VCO of the PLL circuit shown in FIG. 22 using the zero-crossing method according to the present invention;

FIG. 24(b) is a diagram showing a phase fluctuation waveform $\Delta\phi(t)$ estimated by the method according to the present invention;

FIG. 25 is a block diagram showing an example of the PLL circuit having a delay fault which can be tested by the method according to the present invention;

FIG. 26(a) shows an input waveform to a VCO of the PLL circuit shown in FIG. 25;

FIG. 26(b) is a waveform diagram showing an internal clock of the PLL circuit shown in FIG. 25;

FIG. 27(a) is a waveform diagram showing a measurement result obtained by measuring an instantaneous period of an oscillating waveform of the VCO of the PLL circuit shown in FIG. 25 using the zero-crossing method according to the present invention;

FIG. 27(b) is a diagram showing a phase fluctuation waveform $\Delta\phi(t)$ estimated by the method according to the present invention;

FIG. 28 is a block diagram showing another example of the PLL circuit having a delay fault which can be tested by the method according to the present invention;

FIG. 29(a) shows an input waveform to a VCO of the PLL circuit shown in FIG. 28;

FIG. 29(b) is a waveform diagram showing an internal clock of the PLL circuit shown in FIG. 28;

FIG. 30(a) is a waveform diagram showing a measurement result obtained by measuring an instantaneous period of an oscillating waveform of the VCO of the PLL circuit shown in FIG. 28 using the zero-crossing method according to the present invention;

FIG. 30(b) is a diagram showing a phase fluctuation waveform $\Delta\phi(t)$ estimated by the method according to the present invention;

FIG. 31 is a diagram showing an experimental result obtained by testing the PLL circuit shown in FIG. 25 using the method according to the present invention;

FIG. 32 is a diagram showing an experimental result obtained by testing the PLL circuit shown in FIG. 28 using the method according to the present invention;

FIG. 34 shows the waveform of an ideal clock signal;

FIG. 35(a) shows the waveform of a clock signal; and

FIG. 35(b) shows the waveform obtained by Hilbert-transforming the clock signal shown in FIG. 35(a).

DETAILED DESCRIPTION OF THE PREFERRED EMBODIMENTS

Figure 33:
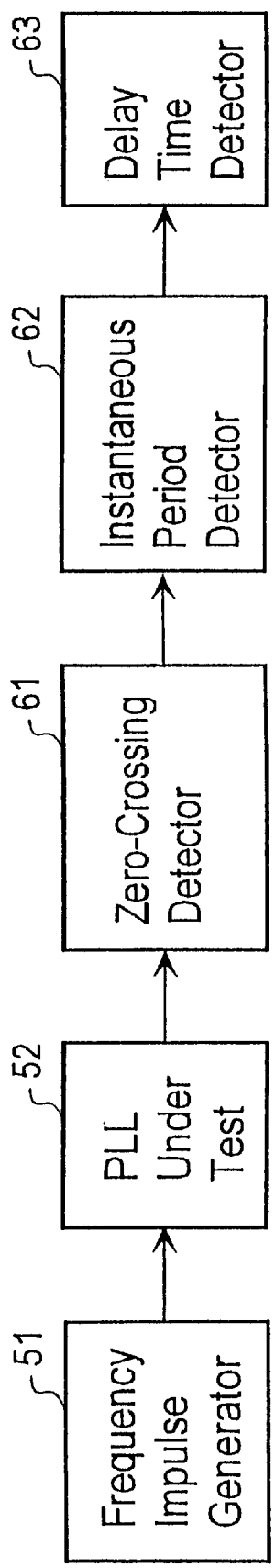
FIG. 33 is a block diagram showing a second embodiment of the delay fault detecting apparatus according to the present invention.

The present invention now will be described in detail hereinafter with reference to FIGS. 13 to 33, in which preferred embodiments of the present invention are shown. The present invention may, however, be embodied in many different forms and/or ways and should not be construed as limited to the embodiments set forth herein; rather, the embodiments are provided so that this disclosure will be thorough and complete, and will fully convey the scope of the invention to those skilled in the art. Like numbers or characters refer to like elements or portions throughout.

Prior to describing preferred embodiments of the invention, the principle of a delay fault detecting method according to the present invention will be discussed. The subject delay fault in this disclosure does not include such delay fault DF1 present at the reference clock input end of the phase-frequency detector 21 as shown in FIG. 3.

As already described, a phase-frequency detector in a PLL circuit compares the phase of the reference clock with that of the internal clock. The output of the phase-frequency detector drives a charge pump circuit. A loop filter removes the ripple from the output of the charge pump circuit and feeds the dc (direct current) signal into a VCO. In short, the phase-frequency detector outputs the phase difference signal to the input of the VCO in order to control its oscillation. Thus, the VCO changes its oscillating frequency to track the frequency of the reference clock. Then, it oscillates at a frequency equal to the frequency of the reference clock and with a phase equal to that of the reference clock. An instantaneous frequency $\Delta f$ is given by differentiating an instantaneous phase $\phi(t)$ of the internal clock or the VCO output with respect to time.

$$\Delta f = \frac{1}{2\pi} \times \frac{d\phi(t)}{dt} \tag{4.1.1}$$

$$f = f_0 + \Delta f \tag{4.1.2}$$

When $\Delta f$ is constant, it is seen, from the equation (4.1.1), that an instantaneous phase exhibits a constant slope: its value at t is a linear function of t.

$$\frac{d\phi(t)}{dt} = 2\pi(\Delta f) \tag{4.2}$$

FIG. 13(a) shows an analog signal being applied to the VCO, and FIG. 13(b) shows a phase deviation $\Delta\phi(t)$ of the VCO output. For example, when the oscillating frequency of the VCO is changed from a high frequency $f_H$ to a low frequency $f_L$, the instantaneous phase exhibits a negative slope as indicated by an arrow in FIG. 13(b). When a Down signal of the analog signal shown in FIG. 13(a) is applied to the VCO, the corresponding change of the phase deviation waveform $\Delta\phi(t)$ becomes as shown in FIG. 13(b). Here, we assume that the PLL circuit has a constant static frequency error $\Delta f_\epsilon$. (for example, refer to a reference literature d8). That is, the phase fluctuation waveform $\Delta\phi(t)$ rapidly changes with a negative inclination in accordance with the Down signal, and changes, after a state transition to a low frequency $f_L$, with an inclination proportional to the static frequency error $\Delta f_\epsilon$. If the static frequency error $\Delta f_\epsilon$ is zero, the phase fluctuation waveform $\Delta\phi(t)$ goes in parallel with the time axis. On the contrary, when the oscillating frequency of the VCO is changed from a low frequency $f_L$ to a high frequency $f_H$, the instantaneous phase exhibits a positive slope as indicated by an arrow in FIG. 14(b). FIG. 14(a) shows an analog signal being applied to the VCO.

FIG. 15 shows waveforms for explaining a concept of a method for estimating a delay time from a phase fluctuation waveform $\Delta\phi(t)$ of a clock waveform $X_c(t)$. FIG. 15(a) shows a phase fluctuation waveform $\Delta\phi(t)$ of a PLL circuit having no delay fault (hereinafter referred to as delay fault-free PLL circuit), and FIG. 15(b) shows a phase fluctuation waveform $\Delta\phi(t)$ of a PLL circuit having at least one delay fault (hereinafter referred to as delay faulty PLL circuit). Note that we assume a delay fault is present at a point other than the reference clock input of the phase-frequency detector. If the instantaneous frequency of the VCO has completed a state transition from a frequency $f_0$ to a frequency $f_1$ at a time point $t_1$, the slope of an instantaneous phase indicates a change expressed by the following equation (4.3.1).

$$\frac{d\phi(t)}{dt} = 2\pi(\Delta f_1), t_1 < t < t_2 \quad (4.3.1)$$

In this case, $\Delta f_1$ is equal to $\Delta f_\epsilon$ or zero. Similarly, if the instantaneous frequency of the VCO has started a state transition from frequency $f_1$ to frequency $f_2$ at a time point $t_2$, the slope of the instantaneous phase is expressed by the following equation (4.3.2).

$$\frac{d\phi(t)}{dt} = 2\pi(\Delta f_2), t_2 < t < t_3 \quad (4.3.2)$$

It turns out that the internal state of the VCO can be monitored by observing the slope of the instantaneous phase waveform. Note that the internal state can be monitored even if $\Delta f_\epsilon$ is zero.

In addition, if an inflection time point, around which the instantaneous phase waveform changes its slope, is identified, we can measure an edge time at which the PLL circuit enters into or exits from some state. Since state transitions lag due to delay faults, delay faults in the PLL circuits can be tested if a time duration $(t_2-t_1)$ during which each PLL circuit stays in a certain state, can be measured. Note that a delay fault present at the reference clock input end of the phase-frequency detector is excluded from the testable faults.

Next, a signal to be applied to the PLL circuit in case of testing a delay fault will be discussed. As already described, an influence of a delay fault can be observed in accordance with a state transition. Even if a sine wave is applied to the PLL circuit, no state transition occurs. Therefore, a stationary signal cannot be utilized in the testing for delay faults.

On the other hand, when a frequency impulse shown in FIG. 16(b) is applied to the PLL circuit, the phase-frequency detector outputs an error signal corresponding to the frequency change and the PLL circuit performs a state transitions. That is, a transient signal should be used as a signal to be applied in the testing for delay faults.

FIG. 16(a) shows a waveform of a frequency impulse signal the frequency of which performs an impulsive change by one period. When a frequency impulse is applied to the reference clock input, the PLL circuit undergoes state transitions twice. When a frequency impulse shown in FIG. 16(b) is applied to the PLL circuit, the phase-frequency detector outputs a frequency Up signal at the rising edge of the impulse, and then outputs a frequency Down signal at the falling edge of the impulse. Accordingly, if a frequency impulse be used, the time duration $(t_2-t_1)$ required by the above equation (4.3.1) can be found uniquely.

The delay fault detecting method and apparatus according to the present invention are invented by paying attention to the slope of an instantaneous phase, and are the developments of a jitter estimating method and apparatus using a clock waveform of a fundamental frequency, respectively. The jitter estimating method and apparatus are disclosed in copending U.S. patent application Ser. No. 09/246,458, filed Feb. 8, 1999, entitled "Apparatus for and Method of Measuring a Jitter" and copending Continuation-in-part patent application Ser. No. 09/408,280, filed Sep. 29, 1999, entitled "Apparatus for and Method of Measuring a Jitter". The descriptions of these U.S. Applications are incorporated herein.

FIG. 17 is a block diagram showing a first embodiment of the delay fault detecting apparatus according to the present invention. This delay fault detecting apparatus comprises a frequency impulse generator 51 for generating a frequency impulse signal, a PLL circuit under test 52 being tested as to whether or not a delay fault is present therein, a Hilbert pair generator 53 to which an output signal from the PLL circuit under test 52 is supplied, an instantaneous phase estimator 54 to which a pair of output signals from the Hilbert pair generator 53 are supplied, a linear phase remover 55 to which an output signal from the instantaneous phase estimator 54 is supplied, and a delay fault finder 56 for determining whether or not a delay fault is present on the basis of an output signal from the linear phase remover 55.

A frequency impulse is applied to the PLL circuit under test 52 as the reference clock signal from the frequency impulse generator 51. Since the frequency of the reference clock signal changes, the PLL circuit under test 52 undergoes state transitions, and hence these state transitions influence the output clock waveform if a delay fault is present in the PLL circuit. The Hilbert pair generator 53 transforms an acquired clock waveform $X_c(t)$ to an analytic signal $z_c(t)$, and the instantaneous phase estimator 54 estimates the instantaneous phase of the analytic signal $z_c(t)$ to measure a delay time from a phase fluctuation term $\Delta\phi(t)$ of the instantaneous phase.

As is described in aforesaid U.S. patent application Ser. No. 09/246,458 and CIP patent application Ser. No. 09/408, 280, in the study of a jitter measuring method, a zero crossing is an important concept. Here, from the view point of period measurement, a relationship between the zero crossing of a waveform and the zero crossing of the fundamental wave of that waveform will be briefly explained on an ideal clock waveform $x_{d50\%}(t)$ shown in FIG. 34 by way of example, which has 50% duty cycle, though it is disclosed in aforesaid U.S. Applications.

Assuming that the period of this ideal clock waveform is $T_0$, the Fourier transform of the clock waveform is given by the following equation (3.1) (for example, refer to Alan V. Oppenheim, Alan S. Willsky and Ian T. Young, "Signals and Systems", Prentice-Hall, Inc., 1983).

$$S_{d50\%}(f) = \sum_{k=-\infty}^{+\infty} \frac{2\sin\left(\frac{\pi k}{2}\right)}{k} \delta(f - kf_0) \quad (3.1)$$

That is, the period of the fundamental wave is equal to the period of the clock signal.

$$T_0 = \frac{1}{f} \delta(f - f_0) \quad (3.2)$$

When the fundamental waveform of the clock signal is extracted, its zero crossings correspond to the zero crossings of the original clock waveform. Accordingly, the period of a clock waveform can be estimated from the zero crossings of its fundamental waveform. In this case, the estimation accuracy is not improved even if some harmonics are added to the fundamental waveform.

Next, Hilbert transform and an analytic signal will be briefly explained (for example, refer to Athanasions Papoulis, "Analysis for Analog and Digital Signals", Gendai Kogakusha, 1982).

As can be seen from the equation (3.1), when the Fourier transform of the waveform $X_a(t)$ is calculated, a power spectrum $S_{aa}(f)$ ranging from negative frequencies through positive frequencies can be obtained. This is called a two-sided power spectrum. The negative frequency spectrum is a mirror image of the positive frequency spectrum about an axis of f=0. Accordingly, the two-sided power spectrum is symmetry about the axis of f=0, namely, $S_{aa}(-f)=S_{aa}(f)$. However, the spectrum of negative frequencies cannot be observed. Instead thereof, we can also define a spectrum $G_{aa}(f)$ in which negative frequencies are cut to zero and observable positive frequencies are doubled. This is called one-sided power spectrum.

$G_{aa}(f)=2S_{aa}(f)$ f>0

$G_{aa}(f)=0$ f<0 $\quad (3.3.2)$ $G_{aa}(f)=S_{aa}(f)[1+\text{sgn}(f)] \quad (3.3.2)$ In the above equation (3.3.2), sgn(f) is a sign function which takes a value of +1 when f is positive and takes a value of −1 when f is negative. This one-sided spectrum corresponds to a spectrum of an analytic signal z(t). The analytic signal z(t) can be expressed in time domain as follows.

$$z(t) \equiv X_a(t) + j\hat{X}_a(t) \quad (3.4)$$

$$\hat{X}_a(t) = H[X_a(t)] = \frac{1}{\pi} \int_{-\infty}^{+\infty} \frac{X_a(\tau)}{t-\tau} d\tau \quad (3.5)$$

The real part in the equation (3.4) corresponds to the original waveform $X_a(t)$. The imaginary part in the equation (3.4) is given by the Hilbert transform $\hat{X}_a(t)$ of the original waveform $X_a(t)$. As shown by the equation (3.5), the Hilbert transform of a waveform $X_a(t)$ is given by a convolution of this waveform $X_a(t)$ and $1/\pi t$.

The Hilbert transform of, for example, a cosine wave $\cos(2\pi f_0 t)$ will be derived as follows.

$$H[\cos(2\pi f_0 t)] = -\frac{1}{\pi} \int_{-\infty}^{+\infty} \frac{\cos(2\pi f_0 t)}{\tau - 1} d\tau$$

$$= -\frac{1}{\pi} \int_{-\infty}^{+\infty} \frac{\cos\{2\pi f_0(y+t)\}}{y} dy$$

$$H[\cos(2\pi f_0 t)] = -\frac{1}{\pi} \left[ \cos(2\pi f_0 t) \int_{-\infty}^{+\infty} \frac{\cos(2\pi f_0 y)}{y} dy - \sin(2\pi f_0 t) \int_{-\infty}^{+\infty} \frac{\sin(2\pi f_0 y)}{y} dy \right]$$

In the above equation, since the integral of the first term is equal to zero and the integral of the second term is π, the following equation (3.6) is obtained.

$$H[\cos(2\pi f_0 t)] = \sin(2\pi f_0 t) \quad (3.6)$$

Similarly, the following equation (3.7) is obtained.

$$H[\sin(2\pi f_0 t)] = -\cos(2\pi f_0 t) \quad (3.7)$$

Next, the Hilbert transform of a square wave corresponding to a clock waveform will be derived (for example, refer to Stefan L. Hahn, "Hilbert Transforms in Signal Processing", Artrch House Inc., 1996). The Fourier series of the ideal clock waveform $x_{d50\%}(t)$ shown in FIG. 34 is given by the following equation (3.8).

$$x_{d50\%}(t) = \frac{1}{2} + \frac{2}{\pi}\left[\cos\frac{2\pi}{T_0}t - \frac{1}{3}\cos3\frac{2\pi}{T_0}t + \frac{1}{5}\cos5\frac{2\pi}{T_0}t - \cdots\right] \quad (3.8)$$

The Hilbert transform of the ideal clock waveform is given, using the above equation (3.6), by the following equation (3.9).

$$H[x_{d50\%}(t)] = \frac{2}{\pi}\left[\sin\frac{2\pi}{T_0}t - \frac{1}{3}\sin3\frac{2\pi}{T_0}t + \frac{1}{5}\sin5\frac{2\pi}{T_0}t - \cdots\right] \quad (3.9)$$

FIG. 35(a) shows the waveform of a clock signal and FIG. 35(b) shows the waveform obtained by Hilbert-transforming the clock signal shown in FIG. 35(a). These waveforms are based on the partial sums up to the 11th-order harmonics, respectively. The period $T_0$ in this example is 20 nsec.

An analytic signal z(t) has been introduced by J. Dugundji to uniquely obtain an envelope of a waveform (for example, refer to J. Dugundji, "Envelopes and Pre-Envelopes of Real Waveforms", IRE Trans. Inform. Theory, vol. IT-4, pp. 53–57, 1958). When an analytic signal z(t) is expressed in a polar coordinate system, the following equations (3.10.1), (3.10.2) and (3.10.3) are obtained.

$$z(t) = A(t)e^{j\Theta(t)} \quad (3.10.1)$$

$$A(t) = \sqrt{X_a^2(t) + \hat{X}_a^2(t)} \quad (3.10.2)$$

$$\Theta(t) = \tan^{-1}\left[\frac{\hat{X}_a(t)}{X_a(t)}\right] \quad (3.10.3)$$

In this case, A(t) represents an envelope of a waveform $X_a(t)$. For this reason, z(t) was called pre-envelope by J. Dugundji. Further, $\Theta(t)$ represents an instantaneous phase of the waveform $X_a(t)$.

If the measured waveform is handled as a complex number, its envelope and instantaneous phase can easily be obtained. Hilbert transform is a tool for transforming a waveform to an analytic signal.

Now, returning to FIG. 17, the Hilbert pair generator 53 transforms a clock waveform $X_c(t)$ to an analytic signal $z_c(t)$. The Hilbert transform of the clock waveform $x_c(t)$ is given, using the above equation (3.6), as follows:

$$\hat{X}_c(t)=H[X_c(t)]=A_c\sin(2\pi f_c t+\theta_c+\Delta\phi(t))$$

In the above equation, $A_c$ is a nominal amplitude value, $f_c$ is a nominal frequency value, $\theta_c$ is an initial phase angle, and $\Delta\phi(t)$ is a phase fluctuation.

Assuming that $X_c(t)$ and $\hat{X}_c(t)$ are a real part and an imaginary part of a complex function respectively, an analytic signal $z_c(t)$ expressed by the following equation is obtained from the Hilbert pair generator 53.

$$z_C(t) = X_C(t) + j\hat{X}_C(t)$$
$$= A_C\cos(2\pi f_C t + \theta_C + \Delta\phi(t)) + jA_C\sin(2\pi f_C t + \theta_C + \Delta\phi(t))$$

Summarizing the signal processing procedure, the estimation of an instantaneous phase of a clock signal $X_c(t)$ by the instantaneous phase estimator 54 results in the following equation (4.4.1) on the basis of the disclosures of aforesaid U.S. Applications.

$$\Theta(t)=[2\pi f_c t+\theta_c+\Delta\phi(t)]\mod 2\pi \qquad (4.4.1)$$

By applying a phase unwrap method disclosed in aforesaid U.S. Applications to $\Theta(t)$ in the linear phase remover 55, the following equation (4.4.2) is obtained.

$$\Theta(t)=2\pi f_c t+\theta_c+\Delta\phi(t) \qquad (4.4.2)$$

In addition, a linear phase $[2\pi f_c t+\theta_c]$ is estimated from $\theta(t)$ using a linear function fitting method also disclosed in aforesaid U. S. Applications. However, the range for estimating a linear phase is limited to up to a time point $t_{impulse}$ at which time a frequency impulse shown in FIG. 16(b) is applied. Thereafter, a linear phase is removed from $\theta(t)$, and hence the fluctuation term $\Delta\phi(t)$ is given by the following equation (4.4.3).

$$\theta(t)=\Delta\phi(t) \qquad (4.4.3)$$

Finally, in the delay fault finder 56, a time duration $(t_2-t_1)$, during which the PLL circuit stays in a certain state, is estimated, using the above equation (4.3.1), from the phase slope in a time duration after the time point timpulse. Whether or not a delay fault is present is determined by comparing the time duration $(t_2-t_1)$ with a time duration $(t_{2,Fault-Free}-t_{1,Fault-Free})$ of the fault-free PLL circuit.

This delay fault detecting method according to the present invention is herein referred to as "$\Delta\phi(t)$ method". This $\Delta\phi(t)$ method can detect any delay fault present in the analog components (the charge pump circuit, the loop filter, or the VCO) of the PLL circuit under test 52.

FIG. 33 is a block diagram showing a second embodiment of the delay fault detecting apparatus according to the present invention. This delay fault detecting apparatus comprises a frequency impulse generator 51 for generating a frequency impulse signal, a PLL circuit under test 52 being tested as to whether or not a delay fault is present therein, a zero-crossing detector 61 for detecting a zero crossing of an output signal from the PLL circuit under test 52, that is, for detecting a time point at which an output signal from the PLL circuit under test 52 crosses the zero amplitude level, an instantaneous period detector 62 for finding an instantaneous period of the output signal from the PLL circuit under test 52 on the basis of the detected zero crossings, and a delay time detector 63 for determining whether or not a delay fault is present in the PLL circuit under test 52.

A reference clock signal the frequency of which is caused to be impulsively changed is applied to the reference clock input terminal of the PLL circuit under test 52 from the frequency impulse generator 51. Since the frequency of the reference clock signal impulsively changes, the PLL circuit under test 52 undergoes state transitions, and hence the influence of these state transitions appears in the output clock waveform if a delay fault is present in the PLL circuit under test 52. The output signal from the PLL circuit under test 52, for example, the output signal from the VCO in the PLL circuit under test 52 is branched into the input terminal of the zero-crossing detector 61 where zero crossings of the output signal from the VCO are detected. The detected zero crossings are fed to the input terminal of the instantaneous period detector 62 which in turn counts a time interval between two adjacent zero crossings by using a counter and finds an instantaneous period of the output signal from the VCO on the basis of the counted time intervals.

The delay time detector 63 detects a delay time extending from the end of the frequency impulse until the instantaneous period of the output signal of the VCO suddenly changes and determines whether or not a delay fault is present in the PLL circuit under test 52 by comparing this delay time with a delay time of the fault-free normal PLL circuit. This delay fault detecting method according to the present invention is referred to as "zero crossing method" herein.

Next, a specific example 1 will be discussed, in which the present invention is applied to a fault-free PLL circuit, that is, a PLL circuit having no delay fault present therein. FIG. 19 is a block diagram showing a fault-free PLL circuit in which any delay fault is not present therein at all. This PLL circuit comprises, as is usual, a phase-frequency detector 21, a charge pump circuit 22, a loop filter 23, a VCO 24 and a clock decode and buffer circuit 25.

The simulations were performed with the SPICE parameter of a 0.6 $\mu$m 5-V CMOS technology. FIG. 18 shows parameters of a CMOSFET. Various waveforms were obtained through SPICE simulations. The oscillating frequency of the VCO 24 was 128 MHz. The time resolution of the simulation waveform was 50 psec. A phase fluctuation waveform $\Delta\phi(t)$ was measured from the waveform of the simulation result. The measurement of this $\Delta\phi(t)$ was simulated using Matlab.

FIG. 20(a) shows an input waveform to the VCO 24. In this specific example 1, a frequency impulse was applied to the reference clock input of the PLL circuit at the time point of 1000.5 nsec. The frequency impulse was changed in its frequency from a high frequency to a low frequency and from a low frequency to a high frequency as shown in FIG. 19. FIG. 20(b) shows an internal clock waveform of the PLL circuit. It is seen that a frequency Down pulse is inputted to the VCO 24 at the next rising edge (time point of approximately 1032 nsec) after the application of the frequency impulse. A frequency Up pulse is applied to the VCO 24 at the time point of approximately 1098 nsec.

FIG. 21 shows waveforms for comparing the zero-crossing method according to the present invention with the $\Delta\phi(t)$ method according to the present invention. FIG. 21(a) is a measurement result of an instantaneous period of the oscillating waveform of the VCO 24 measured by the zero-crossing method of the present invention. The dotted line indicates an instantaneous period of the reference clock waveform. FIG. 21(b) shows a $\Delta\phi(t)$ estimated by using the following algorithm (procedure for transforming a real waveform to an analytic signal of its fundamental frequency) used in the $\Delta\phi(t)$ method of the present invention.

1. $X_c(t)$ is transformed into frequency domain using the fast Fourier transform (FFT).

2. Negative frequency components are cut to zero. Only positive frequency components in the neighborhood of the clock frequency are passed through a band-pass filter (BPF) and other positive frequency components are cut to zero.

3. A spectrum is transformed to time domain using inverse fast Fourier Transform (IFFT).

That is, the spectrum in the frequency range (20 MHz–200 MHz) in which the second harmonic is not included is extracted by a band-pass filter and a $\Delta\phi(t)$ is obtained by the inverse fast Fourier transform.

As can be understood from FIG. 21(a), since the resolution has been made high in the direction of time axis, the instantaneous period of the output signal from the VCO 24 changes in two stages at both the rising edge and the falling edge of the frequency impulse, and is returned to the original period when the longitudinal dotted line of the left side as seen on the drawing is at the time point of the end of the frequency impulse, that is, at the time point of approximately 1066 nsec. From this time point, the internal clock of the PLL circuit starts its frequency tracking operation in correspondence to the frequency impulse, and the state of oscillating frequency undergoes a transition. At the longitudinal dotted line of the right side as seen on the drawing, the VCO 24 is trying to decrease the period in correspondence to the rising edge of the frequency impulse so that the instantaneous period is abruptly decreased, and hence the VCO 24 starts the operation for returning its period to the reference period (period before application of the frequency impulse) at that time point. A time interval 57.70 nsec between these two longitudinal dotted lines is a time duration during which the state of oscillating frequency is undergoing a transition.

Observing the $\Delta\phi(t)$ of FIG. 21(b), it is seen that a state transition due to the frequency Down pulse has completed at the time point $t_1$ of approximately 1050 nsec, and next state transition corresponding to the frequency Up pulse begins at the time point $t_2$ after approximately 58.30 nsec. has passed from the time point $t_1$. This specific example 1 verifies that a time duration during which the PLL circuit stays in a certain state can be estimated if a measurement of the slope of an instantaneous phase and a frequency impulse signal are combined.

Next, a specific example 2 will be explained, in which the present invention is applied to a PLL circuit having a delay fault present at a reference clock input thereof. FIG. 22 is a block diagram showing a PLL circuit in which a delay fault DF1 is present at a reference clock input of the phase-frequency detector 21 in the PLL circuit. The configuration of this PLL circuit is the same as that shown in FIG. 19. This type of delay fault cannot be tested or detected by the method of the present invention. The reason thereof will be made clear in the following.

The PLL circuit shown in FIG. 22 was simulated by SPICE. For the numerical simulation of the delay fault DF1 present at the reference input, a series of even number inverters was inserted into the circuits.

FIG. 23(a) shows an input waveform to the VCO 24. The frequency impulse was changed in its frequency from a high frequency to a low frequency and from a low frequency to a high frequency as shown in FIG. 22. FIG. 23(b) shows an internal clock waveform of the PLL circuit. The dotted line indicates the reference clock waveform. It is seen that the internal clock waveform of the PLL circuit does not become synchronous with the reference clock waveform and that a constant clock skew occurs.

FIG. 24 shows waveforms for comparing the zero-crossing method according to the present invention with the $\Delta\phi(t)$ method according to the present invention. FIG. 24(a) is a measurement result of an instantaneous period of the oscillating waveform of the VCO 24 measured by the zero-crossing method of the present invention. The dotted line indicates an instantaneous period of the reference clock waveform. FIG. 24(b) shows a $\Delta\phi(t)$ estimated by using the aforementioned algorithm (procedure for transforming a real waveform to an analytic signal of its fundamental frequency) used in the $\Delta\phi(t)$ method of the present invention.

It is seen from FIG. 24 that even if a delay fault DF1 is present at the reference clock input end, the PLL circuit has correctly undergone state transitions. Therefore, this type of delay fault cannot be detected by only monitoring the internal states of the PLL circuit. On the contrary, as can be understood from FIG. 23(b), this type of delay fault can easily be detected by comparing it with an external reference clock. This specific example 2 verifies that the method of the present invention cannot detect the delay fault DF1 present at the reference clock input of the PLL circuit.

Next, a specific example 3 will be discussed, in which the present invention is applied to a PLL circuit having a delay fault present at the signal input of the charge pump circuit. FIG. 25 is a block diagram showing a PLL circuit in which a delay fault DF2 is present at the signal input of the charge pump circuit 22 in the PLL circuit. The configuration of this PLL circuit is the same as that shown in FIG. 19.

The charge pump circuit 22 has two signal input terminals. That is, one signal input terminal has a logical signal Up inputted from the phase-frequency detector 21 and the other signal input terminal has a logical signal Down inputted from the phase-frequency detector 21. The logical signal Up or Down inputted from the phase-frequency detector 21 is converted to an analog signal by the charge pump circuit 22. The logical signals Up and Down correspond to state transitions of "increasing the frequency" and of "decreasing the frequency", respectively.

In order to activate various state transitions, different frequency impulses are required. (i): In case of detecting a delay fault DF2 present at the Up signal input of the charge pump circuit 22, the frequency of the frequency impulse signal is sequentially changed from a high frequency to a low frequency and from a low frequency to a high frequency. On the contrary, (ii): in case of detecting a delay fault DF3 (refer to FIG. 28) present at the Down signal input of the charge pump circuit 22, the frequency of the frequency impulse is sequentially changed from a low frequency to a high frequency and from a high frequency to a low frequency. In this case, the same way of thinking as in the stuck-at fault testing already discussed is applied. That is, in case of detecting a stuck-at 0 fault, it may be sufficient that a test pattern which takes an opposite logical value "1"at the fault position is generated.

First, a PLL circuit having a delay fault DF2 present at the Up signal input of the charge pump circuit 22 will be discussed. The PLL circuit shown in FIG. 25 was simulated by SPICE. To simulate the delay fault DF2 present at the UP signal input, a series of even number inverters was inserted into the circuits. The delay time of the delay fault DF2 was 2.957 nsec. The frequency impulse was changed in its frequency from a high frequency to a low frequency and from a low frequency to a high frequency as shown in FIG. 25.

FIG. 26(a) shows an input waveform to the VCO 24. FIG. 26(b) shows an internal clock waveform of the PLL circuit. The dotted line indicates the reference clock waveform.

FIG. 27 shows waveform diagrams for comparing the zero-crossing method according to the present invention with the $\Delta\phi(t)$ method according to the present invention. FIG. 27(a) is a measurement result of an instantaneous period of the oscillating waveform of the VCO 24 measured by the zero-crossing method of the present invention. The dotted line indicates an instantaneous period of the reference clock waveform. The time duration ($t_2$–$t_1$) during which the PLL circuit has stayed in a certain state was estimated to be approximately 61.65 nsec. FIG. 27(b) shows a $\Delta\phi(t)$ estimated by using the aforementioned algorithm (procedure for transforming a real waveform to an analytic signal of its fundamental frequency) used in the $\Delta\phi(t)$ method of the present invention. The time duration $(t_2-t_1)$ was estimated to be approximately 61.90 nsec.

Next, a PLL circuit having a delay fault DF3 present at the Down signal input of the charge pump circuit 22 will be discussed. The PLL circuit shown in FIG. 28 was simulated by SPICE. For the numerical simulation of the delay fault DF3 present at the DOWN signal input, a series of even number inverters was inserted into the circuits. The delay time of the delay fault DF3 was 4.413 nsec. The frequency impulse was changed in its frequency from a low frequency to a high frequency and from a high frequency to a low frequency as shown in FIG. 28.

FIG. 29(a) shows an input waveform to the VCO 24. FIG. 29(b) shows an internal clock waveform of the PLL circuit. The dotted line indicates the reference clock waveform.

FIG. 30 shows waveform diagrams for comparing the zero-crossing method according to the present invention with the $\Delta\phi(t)$ method according to the present invention. FIG. 30(a) is a measurement result of an instantaneous period of the oscillating waveform of the VCO 24 measured by the zero-crossing method of the present invention. The dotted line indicates an instantaneous period of the reference clock waveform. The time duration $(t_2-t_1)$ has been estimated to be approximately 29.25 nsec. FIG. 30(b) shows a $\Delta\phi(t)$ estimated by using the aforementioned algorithm (procedure for transforming a real waveform to an analytic signal of its fundamental frequency) used in the $\Delta\phi(t)$ method of the present invention. The time duration $(t_2-t_1)$ was estimated to be approximately 25.20 nsec.

Now, the $\Delta\phi(t)$ method according to the present invention will be compared with the zero-crossing method according to the present invention. The PLL circuit shown in FIG. 25 was used in this experiment and the delay time of a fault present at the signal input of the charge pump circuit 22 therein was varied from 0 nsec through 7 nsec.

FIG. 31 shows a result of the experiment on the PLL circuit having a delay fault DF2 present at the Up signal input of the charge pump circuit 22. It is seen from FIG. 31 that the $\Delta\phi(t)$ method according to the present invention provides the estimated values which are substantially interchangeable with those of the zero-crossing method according to the present invention. The estimated delay time shows a stepwise change. This is because the phase-frequency detector 21 invokes state transitions of the PLL circuit only at the timings of clock edges.

FIG. 32 shows a result of the experiment on the PLL circuit having a delay fault DF3 present at the Down signal input of the charge pump circuit 22. Comparing the zero-crossing method according to the present invention and the $\Delta\phi(t)$ method according to the present invention with each other, it is seen from FIG. 32 that the zero-crossing method has a large bias error. This is because the measurement points of the zero-crossing method are limited only to the zero-crossings. On the other hand, the $\Delta\phi(t)$ method has no restriction on the time resolution even if the period of the waveform is short. Because it is apparent by comparing FIGS. 31 and 32 with each other that the $\Delta\phi(t)$ method could have detected delay faults equal to or longer than 2 nsec. In other words, the $\Delta\phi(t)$ method according to the present invention can detect delay faults independently of the period of the waveform.

As is apparent from the foregoing results, the $\Delta\phi(t)$ method according to the present invention makes the state of a PLL circuit transit to a low frequency state, and provides estimated values interchangeable with those in the zero-crossing method according to the present invention in case of estimating the time duration during which the PLL circuit stays in a certain state. On the contrary, in case of making the state of the PLL circuit transit to a high frequency state and estimating the time duration during which the PLL circuit stays in a certain state, the $\Delta\phi(t)$ method according to the present invention provides a smaller bias error than that of the zero-crossing method according to the present invention.

However, the $\Delta\phi(t)$ method according to the present invention cannot measure the delay time of a delay fault. This is clear from the fact that each of the time durations $(t_2-t_1)$ plotted in FIGS. 31 and 32 does not change proportionally to the delay time of a delay fault.

As mentioned above, the $\Delta\phi(t)$ method according to the present invention takes the steps of (i) applying a frequency impulse to a PLL circuit; (ii) temporarily staying the PLL circuit in the state of oscillating a certain frequency; and (iii) detecting a delay fault in the PLL circuit by measuring the time duration during which the PLL circuit stays in that frequency oscillating state. Consequently, the delay fault detecting method using the $\Delta\phi(t)$ method according to the present invention is characterized in that no trigger signal is required for a sampling operation, and that no restriction is imposed on the time resolution even if the period of the waveform is short.

On the other hand, the delay fault detecting method using the zero-crossing method according to the present invention requires a trigger signal for a sampling operation, and has a large bias error if the period of the waveform is short. These facts have been verified through SPICE simulations and measurement simulations using Matlab, as mentioned above.

In addition, since a PLL circuit is a feedback system, a delay fault results in a transient skew. Since a timing at which a skew occurs is restricted, it is difficult to implement a test using a trigger as in the zero-crossing method according to the present invention. The reason thereof is that the target zero crossings must precisely be captured. On the contrary, the $\Delta\phi(t)$ method according to the present invention has an advantage that no restriction is imposed on the time resolution. Moreover, there is an advantage that delay faults present in the mixed-signal blocks (the charge pump circuit, the loop filter and the VCO) of the PLL circuit under test can be tested or detected at the same time.

While the present invention has been described with regard to the illustrated embodiments shown by way of example, it will be apparent to those skilled in the art that various modifications, alterations, changes, and/or minor improvements of the embodiments can be made without departing from the spirit and the scope of the present invention. Accordingly, it should be understood that the present invention is not limited to the embodiments shown and described above, and is intended to encompass all such modifications, alterations, changes, and/or minor improvements falling within the scope of the invention defined by the appended claims.

Further, the aforementioned reference literatures d1–d8 are as follows.

[d1]: Jan M. Rabaey, Digital Integrated Circuits: A Design Perspective, Prentice-Hall, Inc., 1996.

[d2]: Hideo Fujiwara, Design and Test of A Computer, Kogakutosho Co. Ltd., 1990.

[d3]: R. Scott Fetherston, Imtiaz P. Shaik and Siyad C. Ma, "Testability Features of AMD-K6 Microprocessor", IEEE International Test Conference, pp. 406–413, 1997.

[d4]: Sudhakar M. Reddy, Delay Fault: Modeling, Fault Simulation, and Test Generation, IEEE International Test Conference Tutorial, 1995.

[d5]: Ankan K. Ppramanick and Sudhakar M. Reddy, "On the Design of Path Delay Fault Testable Combinational Circuits", IEEE International Fault-Tolerant Computing Symposium, pp. 374–381, 1990.

[d6]: Niklaus Wirth, Algorithm +Data Structures= Programs, Prentice-Hall, Inc., 1976.

[d7]: Manfred Schroeder, Fractals, Chaos, Power Laws, W. H. Freeman and Company, 1991.

[d8]: Floyd M. Gardner, "Phase Accuracy of Charge Pump PLL's", IEEE Trans. Commun., vol. COM-30, pp. 2362–2363, 1982.

What is claimed is:

1. A method of detecting a delay fault in a phase-locked loop circuit, comprising the steps of:

applying a frequency impulse to a phase-locked loop circuit to cause a state transition of said phase-locked loop circuit;

estimating, from a signal outputted from said phase-locked loop circuit, an instantaneous phase of said signal; and measuring, from a fluctuation term of said instantaneous phase, a first time duration during which said phase-locked loop circuit stays in a state of oscillating a certain frequency and detecting a delay fault by comparing said first time duration with a second time duration during which a fault-free phase-locked loop circuit having no delay fault present therein stays in a state of oscillating said certain frequency.

2. The delay fault detecting method as set forth in claim 1, wherein said step of estimating an instantaneous phase includes the steps of:

transforming a waveform of the output signal from said phase-locked loop circuit to an analytic signal; and estimating an instantaneous phase of said analytic signal.

3. A method of detecting a delay fault in a phase-locked loop circuit, comprising the steps of:

applying a frequency impulse to a phase-locked loop circuit to cause a state transition of said phase-locked loop circuit;

estimating, from a signal outputted from said phase-locked loop circuit, an instantaneous phase of said signal; and estimating, from a portion of the slope of said instantaneous phase that changes, a time duration during which said phase-locked loop circuit stays in a state of oscillating a certain frequency.

4. A method of detecting a delay fault in a phase-locked loop circuit, comprising the steps of:

applying a frequency impulse to a phase-locked loop circuit to cause a state transition of said phase-locked loop circuit;

estimating, from a signal outputted from said phase-locked loop circuit, an instantaneous period of said signal; and measuring, from said instantaneous period, a time duration during which said phase-locked loop circuit stays in a state of oscillating a certain frequency.

5. The delay fault detecting method as set forth in claim 4, wherein said step of measuring a time duration is a step of measuring a time duration from a time point at which the input frequency impulse ends until a time point at which the instantaneous period of the output signal from said phase-locked loop circuit suddenly changes.

6. An apparatus for detecting a delay fault of a phase-locked loop circuit comprising:

frequency impulse applying means for applying a frequency impulse to a phase-locked loop circuit under test as the reference clock signal;

transform means that is a Hilbert pair generator for transforming the waveform of a signal outputted from said phase-locked loop circuit under test to an analytic signal;

estimating means for estimating an instantaneous phase of said analytic signal;

means for estimating a linear phase from the estimated instantaneous phase and for removing the estimated linear phase from the estimated instantaneous phase to obtain a fluctuation term of the instantaneous phase; and delay time measuring means for measuring a delay time from the fluctuation term, and for detecting a delay fault by comparing a time duration during which said phase-locked loop circuit stays in a state of oscillating a certain frequency with a time duration during which a fault-free phase-locked loop circuit having no delay fault present therein stays in a state of oscillating said certain frequency.

7. The delay fault detecting apparatus as set forth in claim 6, wherein said transform means is a Hilbert pair generator, and further including:

means for estimating a linear phase from the estimated instantaneous phase and removing the estimated linear phase from the estimated instantaneous phase to obtain a fluctuation term of the instantaneous phase.

8. An apparatus for detecting a delay fault of a phase-locked loop circuit comprising:

frequency impulse applying means for applying a frequency impulse to a phase-locked loop circuit under test as the reference clock signal;

transform means for transforming the waveform of a signal outputted from said phase-locked loop circuit under test to an analytic signal;

estimating means for estimating an instantaneous phase of said analytic signal; and estimating a time duration from a portion of the slope of said instantaneous phase that changes.

9. An apparatus for detecting a delay fault in a phase-locked loop circuit, comprising:

frequency impulse applying means for applying a frequency impulse to a phase-locked loop circuit under test as the reference clock signal;

estimating means for estimating, from a signal outputted from said phase-locked loop circuit, an instantaneous period of said signal; and delay time measuring means for measuring a time duration from the estimated instantaneous period.

10. The delay fault detecting apparatus as set forth in claim 9, wherein said delay time measuring means is means for measuring a time duration from a time point at which the input frequency impulse ends until a time point at which the instantaneous period of the output signal from said phase-locked loop circuit suddenly changes.

* * * * *